(12) United States Patent
Niwa

(10) Patent No.: US 11,388,357 B2
(45) Date of Patent: Jul. 12, 2022

(54) SOLID-STATE IMAGING ELEMENT, TEST SYSTEM, AND CONTROL METHOD FOR SOLID-STATE IMAGING ELEMENT

(71) Applicant: Sony Semiconductor Solutions Corporation, Kanagawa (JP)

(72) Inventor: Atsumi Niwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/982,875

(22) PCT Filed: Feb. 7, 2019

(86) PCT No.: PCT/JP2019/004389
§ 371 (c)(1),
(2) Date: Sep. 21, 2020

(87) PCT Pub. No.: WO2019/187684
PCT Pub. Date: Oct. 3, 2019

(65) Prior Publication Data
US 2021/0058575 A1    Feb. 25, 2021

(30) Foreign Application Priority Data

Mar. 28, 2018  (JP) .............................. JP2018-062829

(51) Int. Cl.
| | |
|---|---|
| *H04N 5/367* | (2011.01) |
| *H01L 27/146* | (2006.01) |
| *H04N 5/345* | (2011.01) |
| *H04N 5/3745* | (2011.01) |
| *H04N 5/369* | (2011.01) |
| *H04N 17/00* | (2006.01) |
| *H04N 5/374* | (2011.01) |

(Continued)

(52) U.S. Cl.
CPC ....... *H04N 5/367* (2013.01); *H01L 27/14612* (2013.01); *H01L 27/14643* (2013.01);
(Continued)

(58) Field of Classification Search
CPC .... H04N 5/367; H04N 5/3454; H04N 5/3456; H04N 5/37455; H04N 5/345;
(Continued)

(56) References Cited

U.S. PATENT DOCUMENTS

2004/0075759 A1* 4/2004 Sato ....................... H04N 5/367
348/246
2010/0085438 A1* 4/2010 Richardson ............ H04N 5/378
348/222.1

(Continued)

FOREIGN PATENT DOCUMENTS

| EP | 1881699 A1 | 1/2008 |
|---|---|---|
| GB | 2342456 A | 4/2000 |
| JP | 2016-533140 A | 10/2016 |

OTHER PUBLICATIONS

Extended European Search Report dated Mar. 22, 2021 for corresponding European Application No. 19777234.6.
(Continued)

*Primary Examiner* — Albert H Cutler
(74) *Attorney, Agent, or Firm* — Michael Best & Friedrich LLP

(57) ABSTRACT

Presence or absence of an abnormality is easily determined in a solid-state imaging element that detects an address event. The solid-state imaging element includes a photoelectric conversion element, a test signal supply unit, a selection unit, and a comparator. The photoelectric conversion element converts incident light into an electric signal by photoelectric conversion. The test signal supply unit supplies, as a test signal, a signal that fluctuates with time. The selection unit selects either the electric signal or the test signal. The comparator compares a predetermined threshold value with the signal selected by the selection unit, and outputs a result of the comparison.

17 Claims, 21 Drawing Sheets

(51) Int. Cl.
*H04N 5/378* (2011.01)
*H04N 5/357* (2011.01)

(52) U.S. Cl.
CPC ......... *H04N 5/3454* (2013.01); *H04N 5/3456* (2013.01); *H04N 5/379* (2018.08); *H04N 5/37455* (2013.01); *H04N 17/002* (2013.01)

(58) Field of Classification Search
CPC ........ H04N 5/374; H04N 5/378; H04N 5/357; H04N 17/002; H04N 5/379; H01L 27/14612; H01L 27/14643; H01L 27/146; G01R 31/275; G01R 31/2851; G03B 43/00
USPC ........................................ 348/180, 181, 187
See application file for complete search history.

(56) References Cited

U.S. PATENT DOCUMENTS

| | | | |
|---|---|---|---|
| 2012/0033121 A1* | 2/2012 | Kawata | H04N 5/378 348/308 |
| 2013/0093910 A1* | 4/2013 | Lee | H04N 5/376 348/222.1 |
| 2013/0128086 A1* | 5/2013 | Juen | H04N 5/369 348/302 |
| 2013/0293724 A1* | 11/2013 | Martinussen | H04N 17/002 348/175 |
| 2014/0226027 A1* | 8/2014 | Johansson | H04N 17/002 348/187 |
| 2016/0345005 A1 | 11/2016 | Hoekstra et al. | |
| 2017/0095141 A1* | 4/2017 | Tsutsui | A61B 1/00009 |
| 2017/0171482 A1* | 6/2017 | Wakabayashi | H01L 27/14609 |

OTHER PUBLICATIONS

Lichtsteiner, Patrick et al., "A 128×128 120 dB 15 μs Latency Asynchronous Temporal Contrast Vision Sensor", IEEE Journal of Solid-State Circuits, IEEE, USA, vol. 43, No. 2, Feb. 1, 2008 (Feb. 1, 2008), pp. 566-576, p. 568-569, figures 1, 2; XP011200748, ISSN: 0018-9200, DOI: 10.1109/JSSC.2007.914337.

* cited by examiner

FIG. 12

| TEST SIGNAL | SWITCH SIGNAL | | | | DETECTION RESULT |
|---|---|---|---|---|---|
| | SEL1 | SEL2 | SEL3 | SEL4 | |
| TIN_I−V | 0 (TEST SIGNAL NOT SELECTED) | 0 (TEST SIGNAL NOT SELECTED) | 0 (TEST SIGNAL NOT SELECTED) | 0 (GAIN 1) | DET_I-V |
| TIN_BAFa | 1 (TEST SIGNAL SELECTED) | 0 | 0 | 0 | DET_BAFa |
| TIN_BAFb | 0/1 | 0 | 0 | 0 | DET_BAFb |
| TIN_SUB | 0/1 | 1 (TEST SIGNAL SELECTED) | 0 | 0 | DET_SUB |
| TIN_Q | 0/1 | 0/1 | 1 (TEST SIGNAL SELECTED) | 0 | DET_Q |

FIG. 14
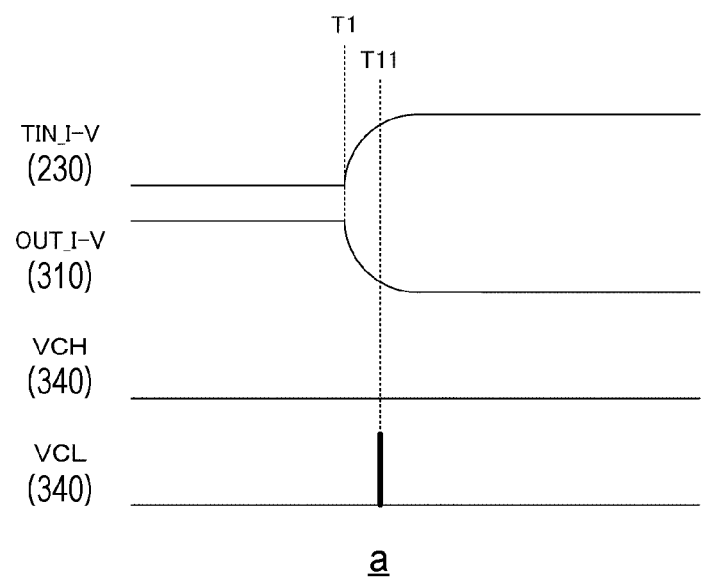
a
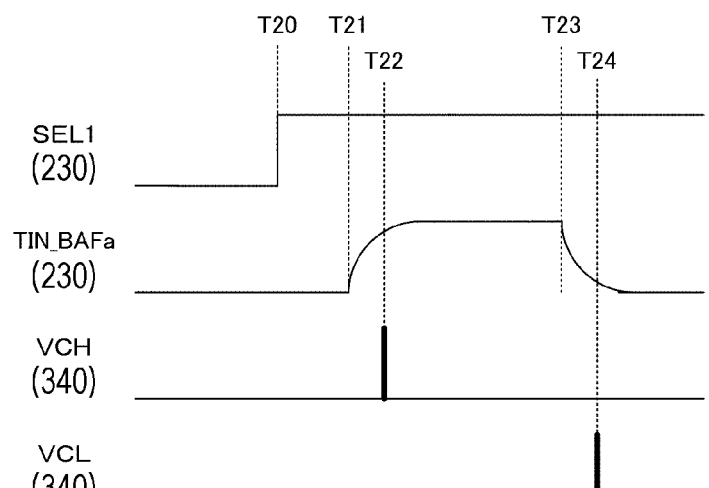
b

FIG. 15

| DETERMINATION RESULT | | | | | ABNORMAL SPOT |
|---|---|---|---|---|---|
| ERR_I-V | ERR_BAFa | ERR_BAFb | ERR_SUB | ERR_Q | |
| 0 (NORMAL) | 0 (NORMAL) | 0 (NORMAL) | 0 (NORMAL) | 0 (NORMAL) | NONE |
| 1 (ABNORMAL) | 0 (NORMAL) | 0 (NORMAL) | 0 (NORMAL) | 0 (ABNORMAL) | CURRENT-VOLTAGE CONVERSION CIRCUIT |
| 0 (ABNORMAL) | 1 (ABNORMAL) | 0 (NORMAL) | 0 (NORMAL) | 0 (NORMAL) | TRANSISTOR ON GROUND SIDE IN BUFFER |
| 0 (ABNORMAL) | 0 (NORMAL) | 1 (ABNORMAL) | 0 (NORMAL) | 0 (NORMAL) | TRANSISTOR ON POWER SOURCE SIDE IN BUFFER |
| 0 (ABNORMAL) | 0 (NORMAL) | 0 (NORMAL) | 1 (ABNORMAL) | 0 (NORMAL) | SUBTRACTOR |
| 0 (ABNORMAL) | 0 (NORMAL) | 0 (NORMAL) | 0 (NORMAL) | 1 (ABNORMAL) | QUANTIZER |

SOLID-STATE IMAGING ELEMENT, TEST SYSTEM, AND CONTROL METHOD FOR SOLID-STATE IMAGING ELEMENT

TECHNICAL FIELD

The present technology relates to a solid-state imaging element, a test system, and a control method for the solid-state imaging element. More specifically, the present technology relates to a solid-state imaging element, a test system, and a control method for the solid-state imaging element in each of which an amount of incident light is compared with a threshold value.

BACKGROUND ART

Conventionally, a synchronous solid-state imaging element that captures image data (frame) in synchronization with a synchronization signal such as a vertical synchronization signal or the like has been used in an imaging device or the like. In this general synchronous solid-state imaging element, image data can be acquired only in every cycle of the synchronization signal (e.g., 1/60 seconds), and therefore, it is difficult to cope with a case where higher speed processing is required in fields related to a user interface and the like of automatic operation and a wearable device. Accordingly, there is a proposed non-synchronous solid-state imaging element provided with an address event detection circuit in which a fact that a change amount of luminance exceeds a threshold value is detected per pixel address in real time as an address event (see Patent Document 1, for example). As a test method for operation of this solid-state imaging element, it is possible to exemplify a test method of placing, for example, a modulation light source that emits pulsed light and analyzing a detection result during emission of the pulsed light.

CITATION LIST

Patent Document

Patent Document 1: Japanese Patent Application National Publication (Laid-Open) No. 2016-533140

SUMMARY OF THE INVENTION

Problems to be Solved by the Invention

In a test method described above, it is possible to determine presence or absence of an abnormality per pixel by analyzing a detection result during emission of pulsed light. However, this test method requires a modulation light source and a device that controls the modulation light source, and therefore, there is a possibility that a system scale is increased and it becomes difficult to perform a test.

The present technology is created in view of such a situation, and directed to facilitating determination on presence or absence of an abnormality in a solid-state imaging element that detects an address event.

Solutions to Problems

The present technology is made to solve the above-described problems, and a first aspect thereof is a solid-state imaging element and a control method therefor, in which the solid-state imaging element includes: a photoelectric conversion element that converts incident light into an electric signal by photoelectric conversion; a test signal supply unit that supplies, as a test signal, a signal that fluctuates with time; a selection unit that selects either the electric signal or the test signal; and a comparator that compares a predetermined threshold value with the signal selected by the selection unit, and outputs a result of the comparison. This configuration brings an operational advantage that the comparison result between either the electric signal or the test signal and the threshold value is output.

Furthermore, in the first aspect, further provided are: a current-voltage conversion circuit that converts a current signal into a voltage signal; a buffer that outputs a buffer input signal as a buffer output signal; and a subtractor that outputs, as a differential signal, a change amount of a signal to be differentiated by subtraction, in which the photoelectric conversion element can also output the current signal as the electric signal to the current-voltage conversion circuit. This configuration brings an operational advantage that the current signal is converted into the voltage signal, a signal to be corrected is corrected, and the change amount of the signal to be differentiated is output as the differential signal.

Furthermore, in the first aspect, the test signal includes a first test signal, the selection unit includes a first selector that selects either the voltage signal or the first test signal and supplies the selected signal to the buffer as the buffer input signal, and the test signal supply unit may supply the first test signal to the first selector. This configuration brings an operational advantage that either the voltage signal or the first test signal is supplied to the buffer.

Furthermore, in the first aspect, the test signal includes a second test signal, the selection unit includes a second selector that selects either the buffer output signal or the second test signal and supplies the selected signal to the subtractor as the signal to be differentiated, and the test signal supply unit may supply the second test signal to the second selector. This configuration brings an operational advantage that either the buffer output signal or the second test signal is supplied to the subtractor.

Furthermore, in the first aspect, the test signal includes a third test signal, the selection unit includes a third selector that selects either the differential signal or the third test signal and supplies the selected signal to the comparator, and the test signal supply unit may supply the third test signal to the third selector. This configuration brings an operational advantage that either the differential signal or the third test signal is supplied to the comparator.

Furthermore, in the first aspect, the test signal includes a fourth test signal, and the test signal supply unit may supply the fourth test signal to the current-voltage conversion circuit. This configuration brings an operational advantage that the voltage signal according to the fourth test signal is output.

Furthermore, in the first aspect, the test signal includes a fifth test signal, and the test signal supply unit may supply the fifth test signal to the buffer.

Furthermore, in the first aspect, in a case where the electric signal is supplied, the subtractor may amplify the signal to be differentiated with a gain larger than a gain in a case where the test signal is supplied. This configuration brings an operational advantage that the signal to be differentiated is amplified.

Furthermore, in the first aspect, it is possible to further provide a transistor that opens and closes, in accordance with a predetermined enable signal, a path between a power source and each of the current-voltage conversion circuit, the buffer, the subtractor, and the comparator. This configuration brings an operational advantage that a pixel is controlled to be enabled or disabled.

Furthermore, in the first aspect, the photoelectric conversion element may be arranged on a predetermined light-receiving chip, and the selection unit and the comparator may be arranged on a detection chip laminated on the light-receiving chip. This configuration brings an operational advantage that presence or absence of an abnormality is determined in the solid-state imaging element having a laminated structure.

Furthermore, in the first aspect, the test signal supply unit may be arranged on the detection chip. This configuration brings an operational advantage that a test signal is supplied in the detection chip.

Furthermore, in the first aspect, the test signal supply unit may be arranged on the light-receiving chip. This configuration brings an operational advantage that a test signal is supplied from the light-receiving chip.

Moreover, a second aspect of the present technology is a test system including: a photoelectric conversion element that converts incident light into an electric signal by photoelectric conversion; a test signal supply unit that supplies, as a test signal, a signal that fluctuates with time; a selection unit that selects either the electric signal or the test signal; a comparator that compares a predetermined threshold value with the signal selected by the selection unit, and outputs a result of the comparison; and an abnormality determination unit that determines presence or absence of an abnormality on the basis of the comparison result. This configuration brings an operational advantage that presence or absence of an abnormality is determined on the basis of the comparison result between either the electric signal or the test signal and the threshold value.

Furthermore, in the second aspect, further provided is a signal processing circuit that invalidates an address event detection circuit having an abnormality out of a plurality of address event detection circuits, in which the selection unit and the comparator may be arranged in each of the plurality of address event detection circuits, and the abnormality determination unit may determine presence or absence of an abnormality with regard to each of the plurality of address event detection circuits. This configuration brings an operational advantage that presence or absence of an abnormality is determined with regard to each of the plurality of address event detection circuits.

Effects of the Invention

According to the present technology, it is possible to provide an excellent effect that presence or absence of an abnormality can be easily determined in the solid-state imaging element that detects an address event.

Note that the effect recited herein is not constantly limited and may include any one of effects recited in the present disclosure.

BRIEF DESCRIPTION OF DRAWINGS

FIG. 12 is a diagram illustrating exemplary detection signals each corresponding to a combination of a test signal and a switch signal in the first embodiment of the present technology.

FIG. 14 is a diagram to describe a control method in the test mode per pixel in the first embodiment of the present technology.

FIG. 15 is a diagram to describe a method of identifying an abnormal spot in the first embodiment of the present technology.

MODE FOR CARRYING OUT THE INVENTION

In the following, modes for carrying out the present technology (hereinafter referred to as "embodiments") will be described. The description will be provided in the following order.

1. First Embodiment (Example of Supplying Test Signal)
2. Second Embodiment (Example of Supplying Test Signal and Disabling Pixel Having Abnormality)
3. Third embodiment (Example in which Circuit That Supplies Test Signal Is Arranged on Light-Receiving Chip)
4. Exemplary Application to Moving Object 1. First Embodiment

[Exemplary Configuration of Test System]

Figure 1:
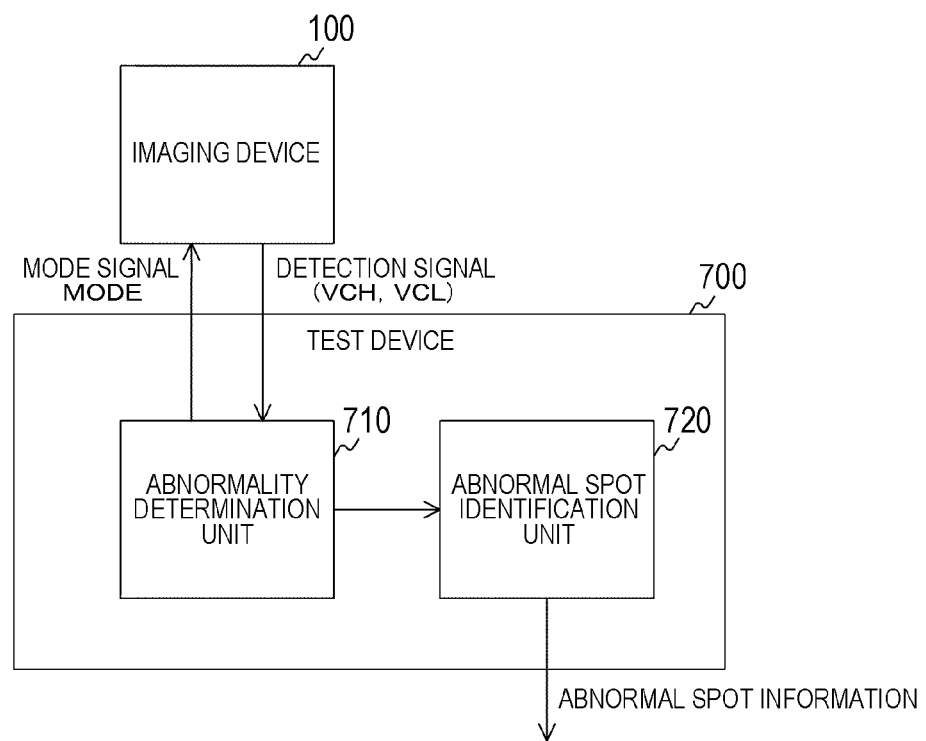
FIG. 1 is a block diagram illustrating an exemplary configuration of a test system in a first embodiment of the present technology.

FIG. 1 is a block diagram illustrating an exemplary configuration of a test system in a first embodiment of the present technology. This test system is a system to test operation of the imaging device, and includes an imaging device 100 and a test device 700.

The imaging device 100 includes a plurality of pixels and detects presence or absence of an address event per pixel. The imaging device 100 supplies, to test device 700, a detection signal indicating a detection result. This detection signal includes, per pixel, an ON event detection signal VCH indicating presence or absence of an ON event and an OFF event detection signal VCL indicating presence or absence of an OFF event. Here, the ON event indicates that a change amount of luminance exceeds a predetermined upper limit threshold value, and the OFF event indicates that the change amount of the luminance is smaller than a predetermined lower limit threshold value that is less than the upper limit threshold value. Note that the imaging device 100 detects presence or absence of both the ON event and the OFF event, but can also detect only one thereof.

The test device 700 tests the operation of the imaging device 100. This test device 700 includes an abnormality determination unit 710 and an abnormal spot identification unit 720.

The abnormality determination unit 710 determines presence or absence of an abnormality per pixel. The abnormality determination unit 710 generates a mode signal MODE that designates either a test mode or a normal mode and supplies the mode signal MODE to the imaging device 100. Here, the test mode is a mode of executing a test for operation of the imaging device 100. On the other hand, the normal mode is a mode of detecting presence or absence of an address event on the basis of a current signal generated by photoelectric conversion without the imaging device 100 executing a test. The test mode is set by user's operation or execution of a predetermined application. It is desirable that the test mode be set under a condition that there is almost no luminance change (such as during shipping, repair, or the like). Furthermore, in the test mode, it is desirable that the solid-state imaging element 200 be shielded from light with a mechanical shutter or the like so as not to change the luminance.

The abnormality determination unit 710 receives a detection signal from the imaging device 100 in the test mode. Then, the abnormality determination unit 710 determines presence or absence of an abnormality per pixel on the basis of the detection signal, and supplies a determination result to the abnormal spot identification unit 720.

The abnormal spot identification unit 720 analyzes the determination result and identifies a spot where an abnormality has occurred in a circuit inside a pixel. The abnormal spot identification unit 720 generates, per pixel, abnormal spot information indicating an abnormal spot, and outputs the abnormal spot information to the outside.

[Exemplary Configuration of Imaging Device]

Figure 2:
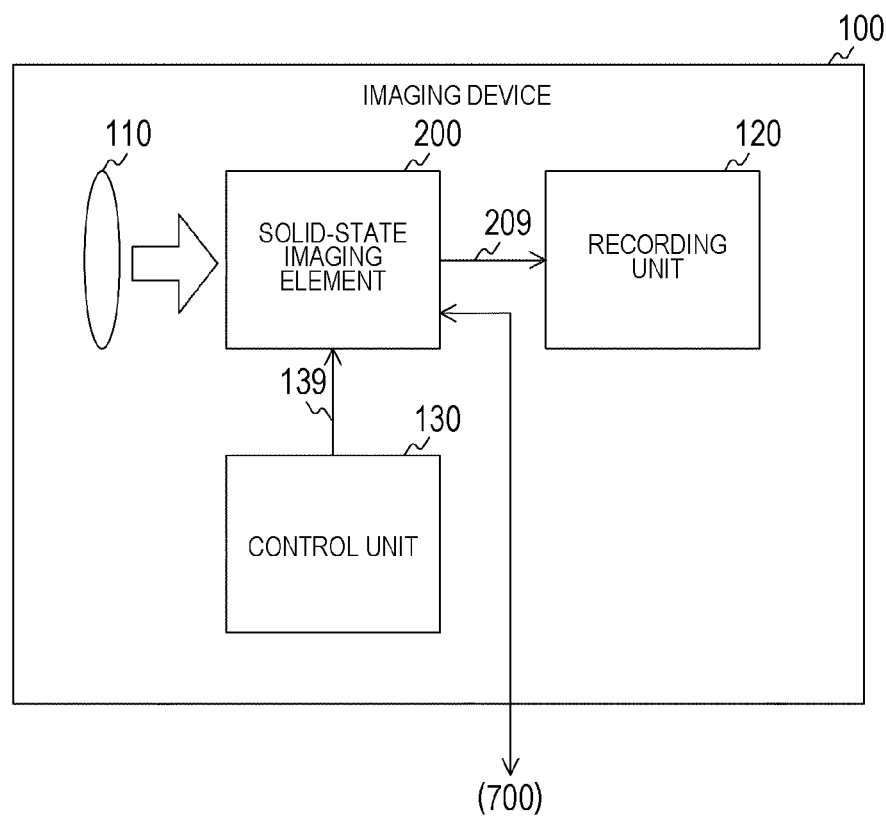
FIG. 2 is a block diagram illustrating an exemplary configuration of an imaging device in the first embodiment of the present technology.

FIG. 2 is a block diagram illustrating an exemplary configuration of the imaging device 100 according to the first embodiment of the present technology. The imaging device 100 includes an imaging lens 110, a solid-state imaging element 200, a recording unit 120, and a control unit 130. As the imaging device 100, a camera mounted on a wearable device, a vehicle-mounted camera, or the like is assumed.

The imaging lens 110 collects incident light and guides the collected light to the solid-state imaging element 200. The solid-state imaging element 200 detects presence or absence of an address event per pixel, and generates a detection signal indicating a detection result thereof. The mode signal MODE from the test device 700 is received in the solid-state imaging element 200. In a case where the normal mode is set by the mode signal MODE, the solid-state imaging element 200 generates a detection signal per pixel on the basis of a current signal generated by photoelectric conversion. Then, the solid-state imaging element 200 executes predetermined signal processing such as image recognition processing and the like for image data including the detection signal, and outputs processed data to the recording unit 120 via a signal line 209.

Then, the solid-state imaging element 200 generates a detection signal from a test signal that fluctuates with time, and supplies the detection signal to the test device 700.

The recording unit 120 records the data from the solid-state imaging element 200. The control unit 130 controls the solid-state imaging element 200 such that the solid-state imaging element 200 captures image data.

[Exemplary Configuration of Solid-State Imaging Element]

Figure 3:
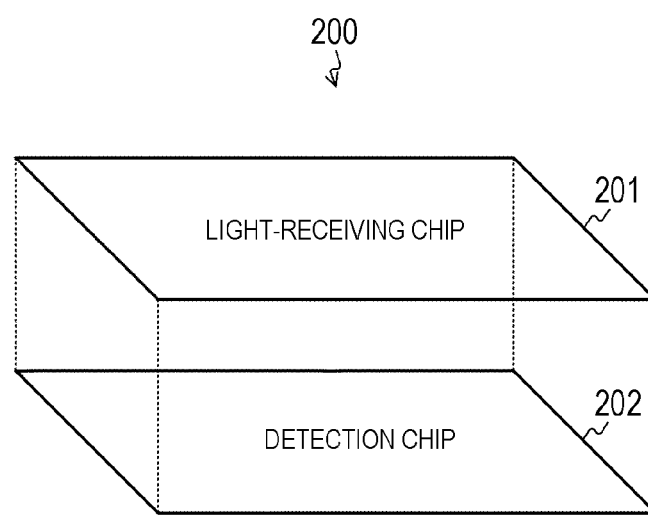
FIG. 3 is a view illustrating an exemplary laminated structure of the solid-state imaging element in the first embodiment of the present technology.

FIG. 3 is a view illustrating an exemplary laminated structure of the solid-state imaging element 200 in the first embodiment of the present technology. The solid-state imaging element 200 includes a detection chip 202 and a light-receiving chip 201 laminated on the detection chip 202. These chips are electrically connected via a connecting portion such as a via or the like. Note that the chips can be connected by Cu—Cu bonding or a bump, besides the via.

[Exemplary Configuration of Light-Receiving Chip]

Figure 4:
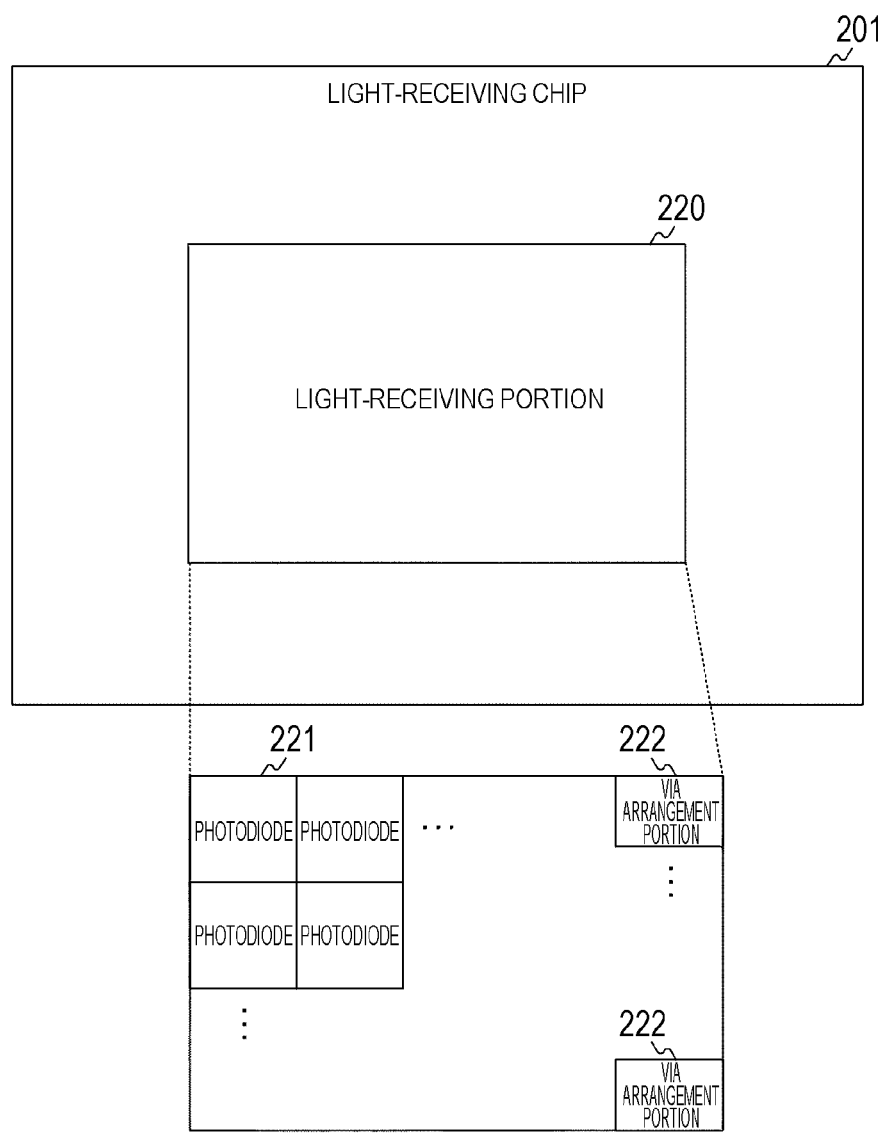
FIG. 4 is an exemplary plan view of a light-receiving chip in the first embodiment of the present technology.

FIG. 4 is an exemplary plan view of the light-receiving chip 201 in the first embodiment of the present technology. The light-receiving chip 201 is provided with a light-receiving portion 220. The light-receiving portion 220 has a plurality of photodiodes 221 arrayed in a two-dimensional grid form. Furthermore, the light-receiving portion 220 is provided with predetermined number of via arrangement portions 222. In these via arrangement portions 222, vias that are connected to the detection chip 202 are arranged. Note that the via arrangement portions 222 are arranged inside the light-receiving portion 220, but can also be arranged outside the light-receiving portion 220.

Each photodiode 221 converts incident light into a current signal by photoelectric conversion. A pixel address including a row address and a column address is allocated to each of these photodiodes 221 and treated as a pixel. Note that each photodiode 221 is an example of a photoelectric conversion element described in the claims.

[Exemplary Configuration of Detection Chip]

Figure 5:
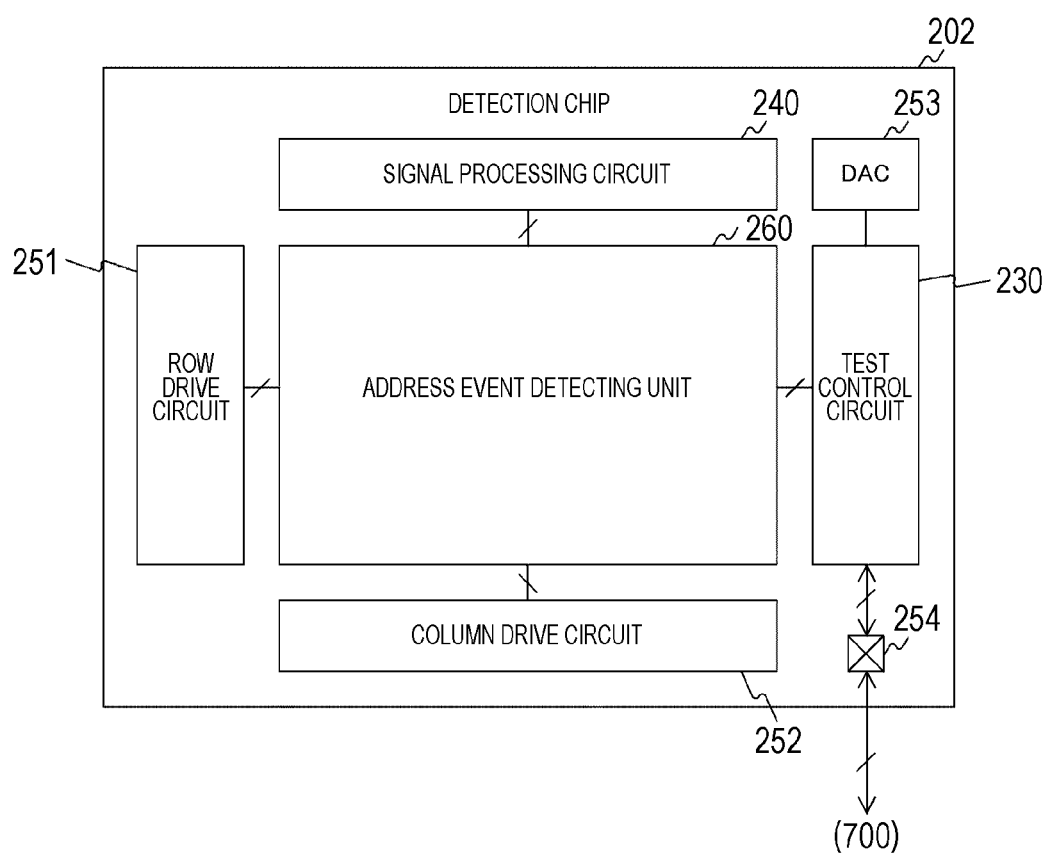
FIG. 5 is an exemplary plan view of a detection chip in the first embodiment of the present technology.

FIG. 5 is an exemplary plan view of the detection chip 202 in the first embodiment of the present technology. This detection chip 202 is provided with a signal processing circuit 240, a row drive circuit 251, a column drive circuit 252, an address event detecting unit 260, a digital to analog converter (DAC) 253, a test control circuit 230, and a pad 254.

The address event detecting unit 260 generates a detection signal. In the normal mode, the address event detecting unit 260 generates a detection signal from a current signal of each of the plurality of photodiodes 221, and supplies the detection signal to the signal processing circuit 240. On the other hand, in the test mode, the address event detecting unit 260 generates a detection signal from a test signal and supplies the detection signal to the test control circuit 230.

The row drive circuit 251 selects a row address and causes the address event detecting unit 260 to output a detection signal corresponding to the row address.

The column drive circuit 252 selects a column address and causes the address event detecting unit 260 to output a detection signal corresponding to the column address.

The signal processing circuit 240 executes the predetermined signal processing for a detection signal from the address event detecting unit 260. The signal processing circuit 240 arrays detection signals as pixel signals in a two-dimensional grid form and acquires image data. Then, the signal processing circuit 240 executes the signal processing such as the image recognition processing and the like for the image data, and supplies a processing result to the recording unit 120.

The DAC 253 generates, by digital to analog (DA) conversion, an analog signal that fluctuates with time as a test signal. This DAC 253 supplies the test signal to the test control circuit 230.

The pad 254 is a terminal to connect the test device 700 and the test control circuit 230.

The test control circuit 230 controls the address event detecting unit 260 in the test mode. The mode signal MODE is received in the test control circuit 230 via the pad 254. In a case where the test mode is set by the mode signal MODE, the test control circuit 230 supplies a digital control signal to the DAC 253 to cause the DAC 253 to generate a test signal. Then, the test control circuit 230 receives the test signal from the DAC 253 and supplies the test signal to the address event detecting unit 260. Furthermore, the test control circuit 230 controls the address event detecting unit 260 such that the address event detecting unit 260 generates a detection signal from the test signal. Next, the test control circuit 230 receives the detection signal from the address event detecting unit 260 and supplies the detection signal to the test device 700 via the pad 254.

Figure 6:
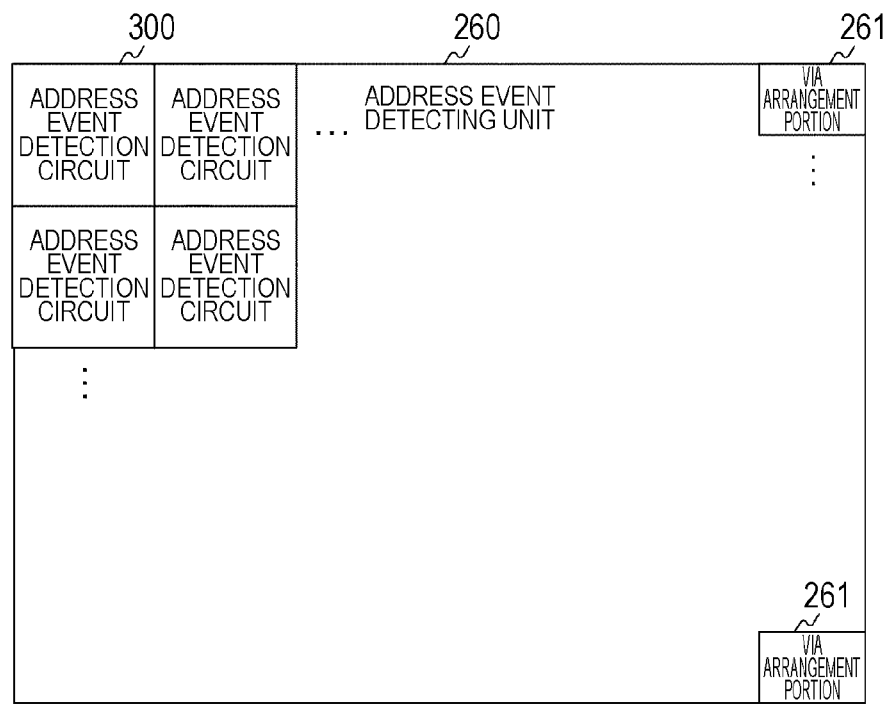
FIG. 6 is an exemplary plan view of an address event detecting unit in the first embodiment of the present technology.

FIG. 6 is an exemplary plan view of the address event detecting unit 260 in the first embodiment of the present technology. This address event detecting unit 260 has a plurality of address event detection circuits 300 arrayed in a two-dimensional grid form. A pixel address is allocated to each of the address event detection circuits 300, and each address event detection circuit is connected to each photodiode 221 having the same address. Furthermore, the address event detecting unit 260 has predetermined number of the via arrangement portions 261 arranged therein. In these via arrangement portions 261, vias that are connected to the light-receiving chip 201 are arranged. Note that the via arrangement portions 261 are arranged inside the address event detecting unit 260 but can also be arranged outside thereof.

The address event detection circuit 300 generates and outputs a detection signal. In the normal mode, this address event detection circuit generates a detection signal from a current signal generated by a corresponding photodiode 221, and outputs the detection signal to the signal processing circuit 240. On the other hand, in the test mode, the address event detection circuit 300 generates a detection signal from a test signal and outputs the detection signal to the test control circuit 230.

[Exemplary Configuration of Test Control Circuit]

Figure 7:
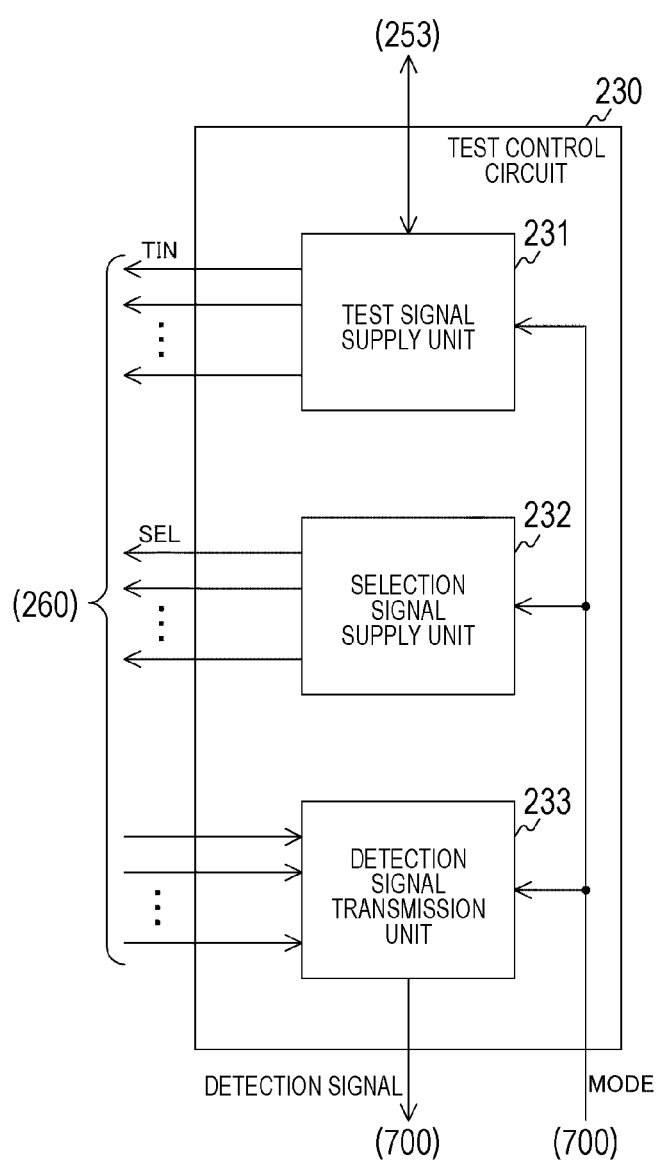
FIG. 7 is a block diagram illustrating an exemplary configuration of a test control circuit in the first embodiment of the present technology.

FIG. 7 is a block diagram illustrating an exemplary configuration of the test control circuit 230 in the first embodiment of the present technology. The test control circuit 230 includes a test signal supply unit 231, a selection signal supply unit 232, and a detection signal transmission unit 233. The mode signal MODE from the test device 700 is received in the test signal supply unit 231, the selection signal supply unit 232, and the detection signal transmission unit 233.

The test signal supply unit 231 supplies a test signal TIN. When the test mode is set, the test signal supply unit 231 causes the DAC 253 to generate the test signal TIN by a control signal. Then, the test signal supply unit 231 receives the test signal TIN from the DAC 253, selects an arbitrary row in the address event detecting unit 260, and supplies the test signal to the selected row. This processing is sequentially executed for all of the rows. In a case where the number of rows is N (N is an integer), the test signal is generated N times.

The selection signal supply unit 232 supplies a selection signal SEL. When the test mode is set, the selection signal supply unit 232 generates the selection signal SEL and supplies the selection signal to each of the pixels in the address event detecting unit 260. The selection signal SEL will be described later in detail.

The detection signal transmission unit 233 transmits a detection signal from the address event detecting unit 260 to the test device 700 in the test mode.

[Exemplary Configuration of Address Event Detection Circuit]

Figure 8:
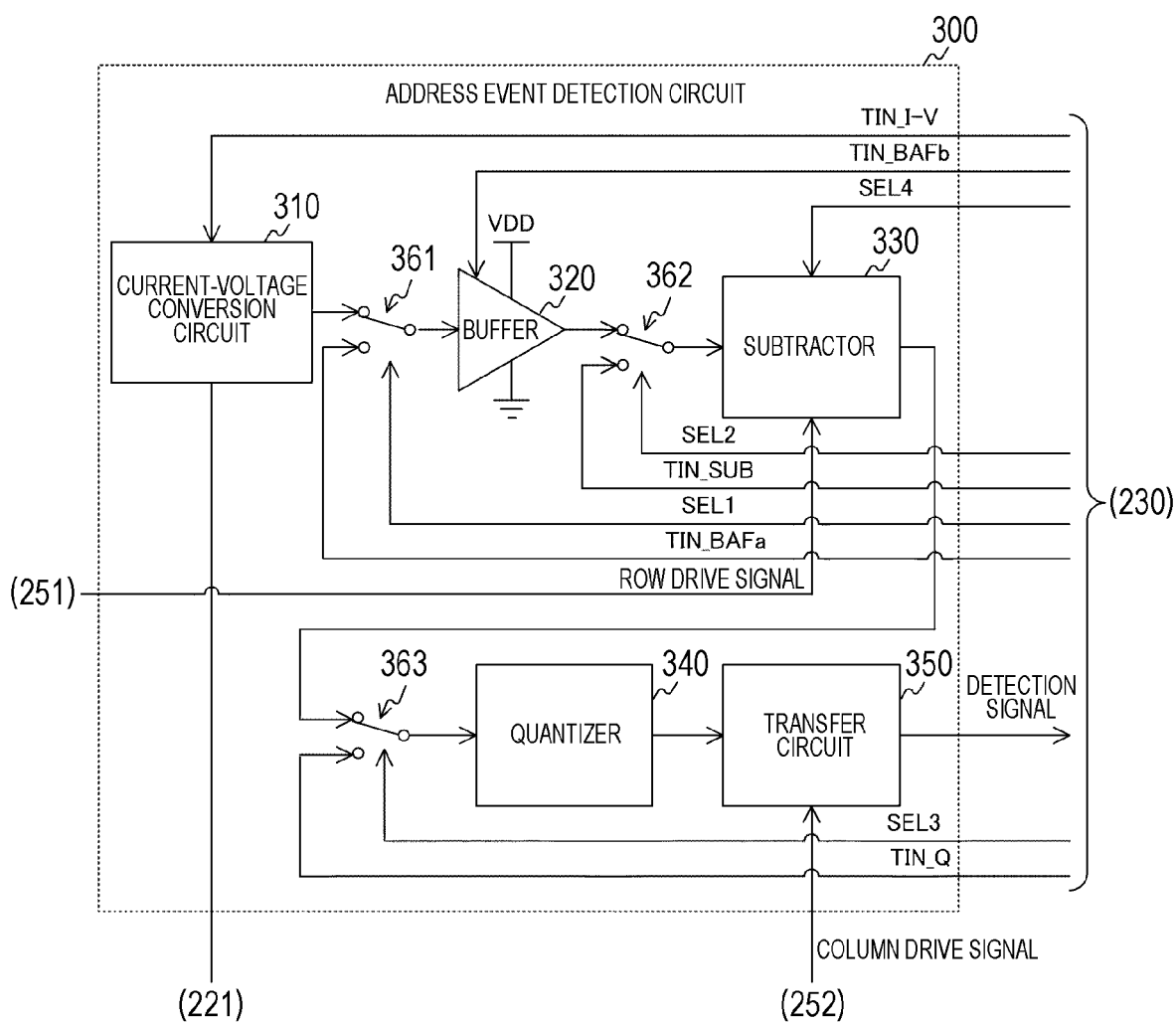
FIG. 8 is a block diagram illustrating an exemplary configuration of the address event detection circuit in the first embodiment of the present technology.

FIG. 8 is a block diagram illustrating an exemplary configuration of the address event detection circuit 300 in the first embodiment of the present technology. The address event detection circuit 300 includes a current-voltage conversion circuit 310, a buffer 320, a subtractor 330, a quantizer 340, a transfer circuit 350, and selectors 361, 362, and 363.

The current-voltage conversion circuit 310 converts, into a voltage signal, a current signal from a corresponding photodiode 221. The current-voltage conversion circuit 310 supplies the voltage signal to the selector 361. Furthermore, a test signal TIN_I-V from the test control circuit 230 is received in the current-voltage conversion circuit 310 in the test mode. Note that the test signal TIN_I-V is an example of a fourth test signal described in the claims.

The selector 361 selects either a test signal TIN_BAFa from the test control circuit 230 or a voltage signal from the current-voltage conversion circuit 310. The selector 361 selects either the test signal TIN_BAFa or the voltage signal in accordance with a selection signal SEL1 from the test control circuit 230 and supplies the selected signal to the buffer 320 as a buffer input signal. Note that the test signal TIN_BAFa is an example of a first test signal described in the claims, and the selector 361 is an example of a first selector described in the claims.

The buffer 320 outputs a buffer input signal from the selector 361. This buffer 320 can improve drive force that drives a subsequent stage. Furthermore, the buffer 320 can secure isolation from noise accompanied by switching operation in the subsequent stage. This buffer 320 supplies the supplied buffer input signal as it is to the selector 362 as a buffer output signal. Furthermore, a test signal TIN_BAFb from the test control circuit 230 is received in the buffer 320 in the test mode. Note that the test signal TIN_BAFb is an example of a fifth test signal described in the claims.

The selector 362 selects either a test signal TIN_SUB from the test control circuit 230 or the buffer output signal from the buffer 320. The selector 362 selects either the test signal TIN_SUB or the buffer output signal in accordance with a selection signal SEL2 from the test control circuit 230, and supplies the selected signal to the subtractor 330 as a signal to be differentiated. Note that the test signal TIN_SUB is an example of a second test signal described in the claims, and the selector 362 is an example of a second selector described in the claims.

The subtractor 330 obtains, by subtraction, a change amount of the signal to be differentiated. The subtractor 330 supplies the change amount as a differential signal to the selector 363. Furthermore, the subtractor 330 switches a gain for the differential signal in accordance with a selection signal SEL4 from the test control circuit 230.

The selector 363 selects either a test signal TIN_Q from the test control circuit 230 or the differential signal from the subtractor 330. The selector 363 selects either the test signal TIN_Q or the differential signal in accordance with a selection signal SEL3 from the test control circuit 230, and supplies the selected signal to the quantizer 340 as a signal to be quantized. Note that the test signal TIN_Q is an example of a third test signal described in the claims, and the selector 363 is an example of a third selector described in the claims.

The quantizer 340 converts (in other words, quantizes), into a detection signal, the signal to be quantized by comparing a predetermined threshold value with the signal to be quantized. This quantizer 340 compares the signal to be quantized with each of the upper limit threshold value and the lower limit threshold value, and supplies each of these comparison results to the transfer circuit 350 as a 2-bit detection signal. Note that the quantizer 340 is an example of a comparator described in the claims.

The transfer circuit 350 transfers a detection signal in accordance with a column drive signal from the column drive circuit 252. In the normal mode, the transfer circuit 350 transfers the detection signal from the quantizer 340 to the signal processing circuit 240. On the other hand, in the test mode, the transfer circuit 350 transfers the detection signal from the quantizer 340 to the test control circuit 230.

The above-described five test signals (TIN_I-V, TIN_BAFa, TIN_BAFb, TIN_SUB, and TIN_Q) and the above-described four selection signals (SEL1 to SEL4) are respectively transmitted to each row via horizontal signal lines different from each other.

Figure 9:
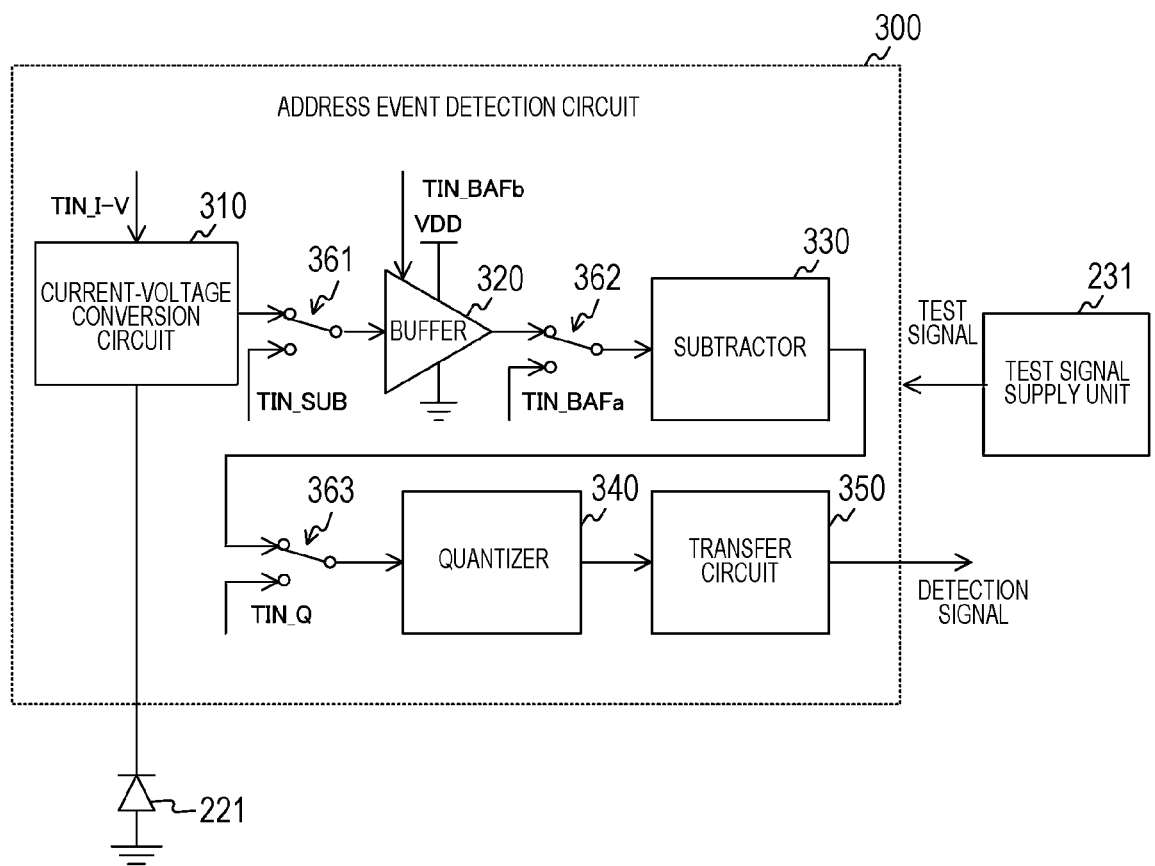
FIG. 9 is a diagram to describe a test method in the first embodiment of the present technology.

FIG. 9 is a diagram to describe a test method in the first embodiment of the present technology. When the test mode is set, the test signal supply unit 231 sequentially selects rows and supplies a test signal to each of the rows.

The photodiode 221 converts incident light into a current signal.

Furthermore, the selectors 361, 362, and 363 in the address event detection circuit 300 each select a test signal in the test mode, and select an electric signal generated from a current signal in the normal mode. Note that the circuit including the selectors 361, 362, and 363 is an example of a selection unit described in the claims.

The quantizer 340 compares a signal selected by the selector 363 with the threshold value, and outputs a comparison result as a detection signal.

As described above, in the test mode, the test signal supply unit 231 supplies a test signal, the selector 361 or the like selects the test signal, and the quantizer 340 generates a detection signal, and therefore, the test system can determine presence or absence of an abnormality without using any modulation light source.

[Exemplary Configurations of Current-Voltage Conversion Circuit and Buffer]

Figure 10:
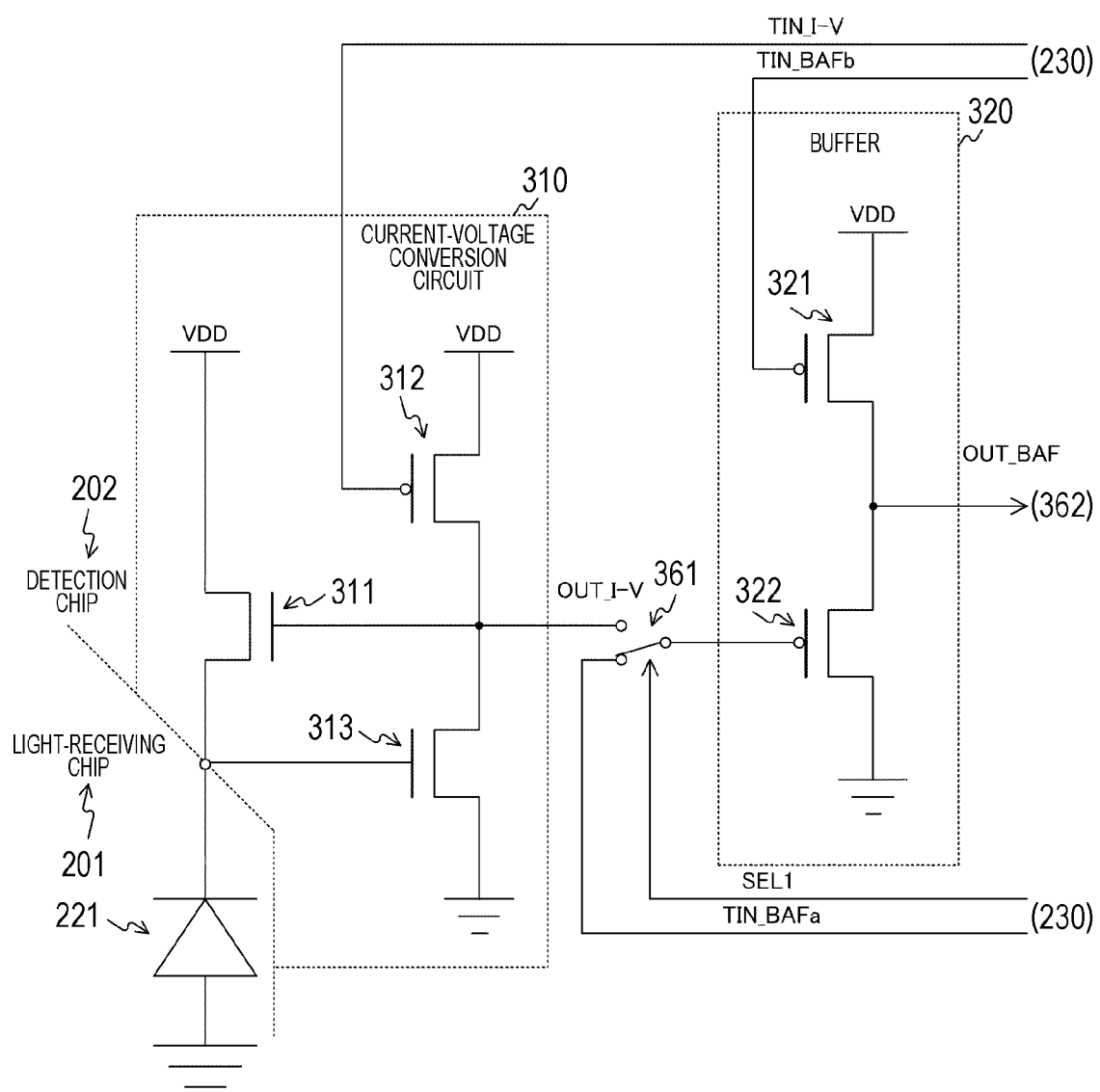
FIG. 10 is a circuit diagram illustrating exemplary configurations of a current-voltage conversion circuit and a buffer in the first embodiment of the present technology.

FIG. 10 is a circuit diagram illustrating exemplary configurations of the current-voltage conversion circuit 310 and the buffer 320 in the first embodiment of the present technology.

The current-voltage conversion circuit 310 includes N-type transistors 311 and 313 and a P-type transistor 312. As these transistors, metal-oxide-semiconductor (MOS) transistors are used, for example.

The N-type transistor 311 has a source connected to a cathode of a photodiode 221, and has a drain connected to a power source terminal. The P-type transistor 312 and the N-type transistor 313 are connected in series between the power source terminal and a ground terminal. Furthermore, a connection point between the P-type transistor 312 and the N-type transistor 313 is connected to a gate of the N-type transistor 311 and an input terminal of the selector 361.

Furthermore, predetermined bias voltage is applied to a gate of the P-type transistor 312 in the normal mode, and the test signal TIN_I-V is received therein in the test mode.

The N-type transistors 311 and 313 each have a drain connected to a power source side, and such a circuit is called a source follower. A current signal from the photodiode 221 is converted into a voltage signal by these two source followers connected in a loop. Furthermore, the P-type transistor 312 supplies constant current to the N-type transistor 313.

Furthermore, a ground of the light-receiving chip 201 and a ground of the detection chip 202 are separated from each other in order to prevent interference.

The buffer 320 includes P-type transistors 321 and 322. As these transistors, MOS transistors are used, for example.

The P-type transistors 321 and 322 are connected in series between a power source terminal and a ground terminal. Furthermore, predetermined bias voltage is applied to a gate of the P-type transistor 321 in the normal mode, and the test signal TIN_BAFb is received therein in the test mode. The P-type transistor 322 has a gate connected to an output terminal of the selector 361. The buffer output signal OUT_BAF is output from a connection point of the P-type transistors 321 and 322.

[Exemplary Configurations of Subtractor and Quantizer]

Figure 11:
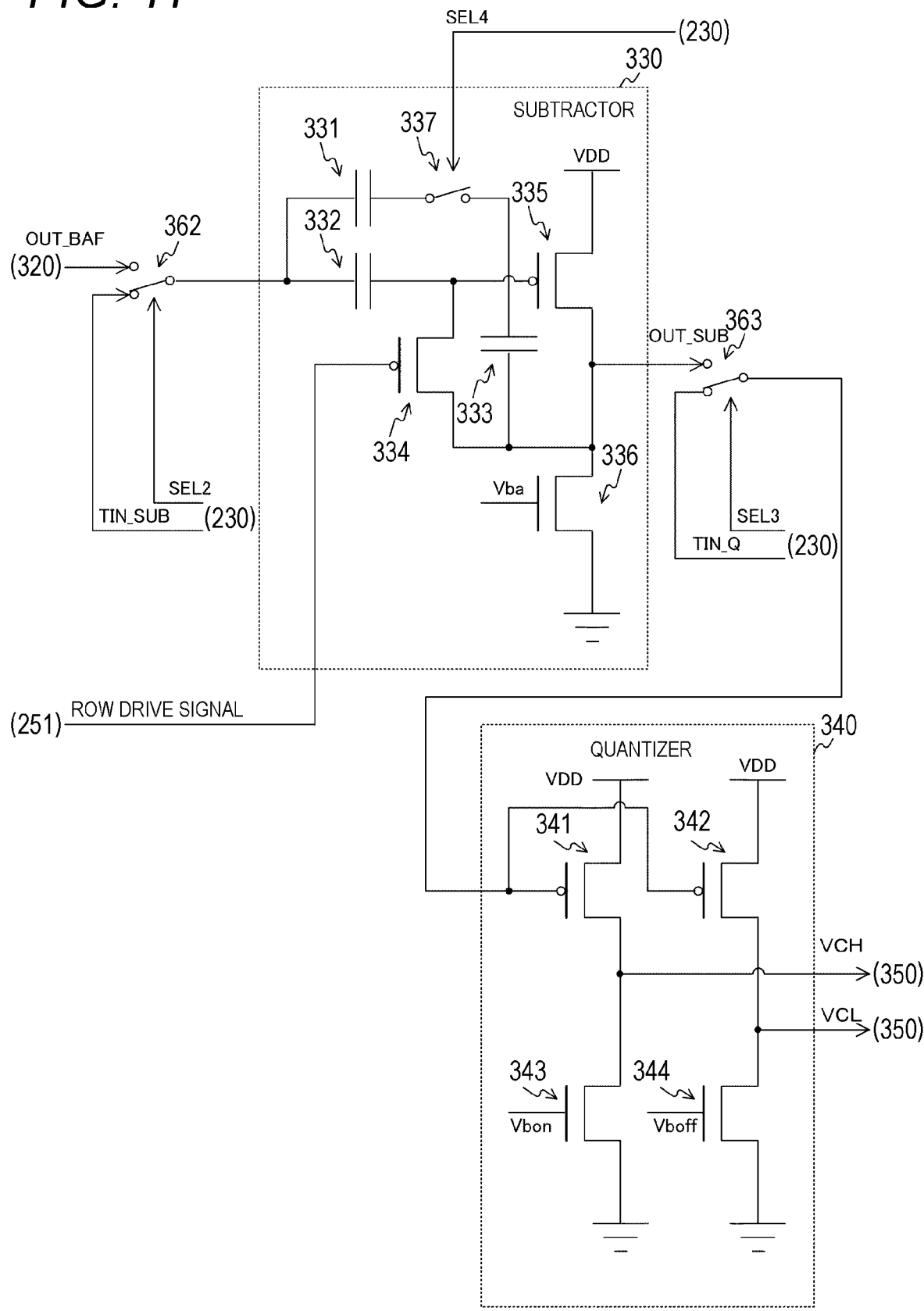
FIG. 11 is a circuit diagram illustrating exemplary configurations of a subtractor and a quantizer in the first embodiment of the present technology.

FIG. 11 is a circuit diagram illustrating exemplary configurations of the subtractor 330 and the quantizer 340 in the first embodiment of the present technology. The subtractor 330 includes capacitors 331 to 333, P-type transistors 334 and 335, an N-type transistor 336, and a switch 337. As the P-type transistor 334, the P-type transistor 335, and the N-type transistor 336, MOS transistors are used, for example.

The P-type transistor 335 and the N-type transistor 336 are connected in series between a power source terminal and a ground terminal. The differential signal OUT_SUB is output from a connection point of the P-type transistor 335 and the N-type transistor 336.

The P-type transistor 334 short-circuits between a gate of the P-type transistor 335 and a connection point of the P-type transistor 335 and the N-type transistor 336 in accordance with a row drive signal from the row drive circuit 251.

The capacitor 331, the switch 337, and the capacitor 333 are connected in series between an output terminal of the selector 362 and the connection point of the P-type transistor 335 and the N-type transistor 336. The capacitor 332 is inserted between the output terminal of the selector 362 and the gate of the P-type transistor 335.

The switch 337 opens/closes a path between the capacitor 331 and the capacitor 333 in accordance with the selection signal SEL4 from the test control circuit 230.

With the above-described configuration, the subtractor 330 is supplied with a signal to be differentiated from the selector 362 and generates, by subtraction, a differential signal indicating a change amount of the signal. In a case where the switch 337 is in an ON state, a gain G of the subtractor 330 is larger than 1 and is represented by the following Expression.

$$G = (C1 + C2)/C3$$

In the above Expression, C1, C2, and C3 are capacitance values of the capacitors 331, 332, and 333.

On the other hand, in a case where the switch 337 is in an OFF state, the gain G becomes 1 time. The test control circuit 230 turns off the switch 337 in accordance with the selection signal SEL4 in the test mode. On the other hand, the switch 337 is controlled to be the ON state in the normal mode.

The quantizer 340 includes: P-type transistors 341 and 342; and N-type transistors 343 and 344. As these transistors, MOS transistors are used, for example.

The P-type transistor 341 and the N-type transistor 343 are connected in series between a power source terminal and a ground terminal, and the P-type transistor 342 and the N-type transistor 344 are also connected in series between a power source terminal and a ground terminal. Furthermore, the P-type transistors 341 and 342 each have a gate connected to an output terminal of the selector 363. Bias voltage Vbon indicating the upper limit threshold value is applied to the gate of the N-type transistor 343, and bias voltage Vboff indicating the lower limit threshold value is applied to the gate of the N-type transistor 344.

A connection point of the P-type transistor 341 and the N-type transistor 343 is connected to the transfer circuit 350, and voltage at this connection point is output as an ON event detection signal VCH. A connection point of the P-type transistor 342 and the N-type transistor 344 is also connected to the transfer circuit 350, and voltage at this connection point is output as an OFF event detection signal VCL. With such connections, in a case where a differential signal exceeds the upper limit threshold value, the quantizer 340 outputs the high-level ON event detection signal VCH, and in a case where the differential signal is smaller than the lower limit threshold value, the quantizer 340 outputs the low-level OFF event detection signal VCL.

Note that the photodiodes 221 are arranged on the light-receiving chip 201 and the circuits in the subsequent stage are arranged on the detection chip 202, but the circuits arranged on the respective chips are not limited to this configuration. For example, the photodiodes 221 and the N-type transistors 311 and 313 can be arranged on the light-receiving chip 201, and others can be arranged on the detection chip 202. Furthermore, the photodiodes 221 and the current-voltage conversion circuit 310 can be arranged on the light-receiving chip 201, and others can be arranged on the detection chip 202. Furthermore, the photodiodes 221, the current-voltage conversion circuit 310, and the buffer 320 can be arranged on the light-receiving chip 201, and the others can be arranged on the detection chip 202. Furthermore, the photodiodes 221, the current-voltage conversion circuit 310, the buffer 320, and a part of the capacitors 331 to 333 can be arranged on the light-receiving chip 201, and others can be arranged on the detection chip 202. Furthermore, the photodiodes 221, the current-voltage conversion circuit 310, the buffer 320, the subtractor 330, and the quantizer 340 can be arranged on the light-receiving chip 201, and others can be arranged on the detection chip 202.

FIG. 12 is a diagram illustrating exemplary detection signals each corresponding to a combination of a test signal and a switch signal in the first embodiment of the present technology. In the test mode, the test control circuit 230 sequentially selects rows and supplies the test signal TIN_I-V to each of the rows. Furthermore, at this time, the test control circuit 230 controls the selection signals SEL1 to 4 such that the selection signals SEL1 to 4 are low level. With this control, the selectors 361 to 363 do not select a test signal, and the gain G of the subtractor 330 is controlled to become 1. Then, a detection signal DET_I-V is output per pixel. Each detection signal DET_I-V includes an ON event detection signal VCH and an OFF event detection signal VCL.

Next, the test control circuit 230 sequentially selects rows and supplies the test signal TIN_BAFa to each of the rows. Furthermore, at this time, the test control circuit 230 controls the selection signal SEL1 such that the selection signal SEL1 is the high level, and controls the rest of the selection signals such that the rest of the selection signals are the low level. With this control, the selector 361 selects the test signal, and a detection signal DET_BAFa is output per pixel. Each detection signal DET_BAFa includes an ON event detection signal VCH and an OFF event detection signal VCL.

Furthermore, the test control circuit 230 sequentially selects rows and supplies the test signal TIN_BAFb to each of the rows. Furthermore, at this time, the test control circuit 230 controls the selection signals SEL2 to SEL4 such that the selection signals SEL2 to SEL4 are the low level. The selection signal SEL1 may be either the high level or the low level. With this control, a detection signal DET_BAFb is output per pixel. Each detection signal DET_BAFb includes an ON event detection signal VCH and an OFF event detection signal VCL.

Next, the test control circuit 230 sequentially selects rows and supplies the test signal TIN_SUB to each of the rows. Furthermore, at this time, the test control circuit 230 controls the selection signal SEL2 such that the selection signal SEL2 is the high level, and controls the selection signals SEL3 and SEL4 such that the selection signals SEL3 and SEL4 are the low level. The selection signal SEL1 may be either the high level or the low level. With this control, the selector 362 selects the test signal, and a detection signal DET_SUB is output per pixel. Each detection signal DET_SUB includes an ON event detection signal VCH and an OFF event detection signal VCL.

Finally, the test control circuit 230 sequentially selects rows and supplies the test signal TIN_Q to each of the rows. Furthermore, at this time, the test control circuit 230 controls the selection signal SEL3 such that the selection signal SEL3 is the high level, and controls the selection signal SEL4 such that the selection signal SEL4 is the low level. The selection signals SEL1 and SEL2 may be either the high level or the low level. With this control, the selector 363 selects the test signal, and a detection signal DET_Q is output per pixel. Each detection signal DET_Q includes an ON event detection signal VCH and an OFF event detection signal VCL.

The abnormality determination unit 710 in the subsequent stage determines, per pixel, whether or not an address event corresponding to fluctuation of the test signal is detected, and in a case where the corresponding address event is not detected, the abnormality determination unit 710 determines that there is an abnormality. The abnormality determination unit 710 generates, per pixel, an abnormality signal ERR_I-V indicating presence or absence of an abnormality from the detection signal DET_I-V. Similarly, abnormality signals ERR_BAFa, ERR_BAFb, ERR_SUB, and ERR_Q are generated per pixel from the detection signals DET_BAFa, DET_BAFb, DET_SUB, and DET_Q, respectively.

Note that the test control circuit 230 supplies the test signals in the order of TIN_I-V, TIN_BAFa, TIN_BAFb, TIN_SUB, and TIN_Q, but the supply order is not constantly required to be this order.

Furthermore, the test control circuit 230 supplies all of the test signals TIN_I-V, TIN_BAFa, TIN_BAFb, TIN_SUB, and TIN_Q, but can also supply a part of these test signals (such as TIN_Q or the like only). In this case, the selector 361 and the like become partly unnecessary.

Furthermore, the test control circuit 230 selects each row and supplies a test signal thereto, but a unit of selection may be other than the row. The test control circuit 230 can sequentially select, for example, a plurality of blocks each including predetermined number of pixels, and can also supply a test signal to each of the blocks.

Figure 13:
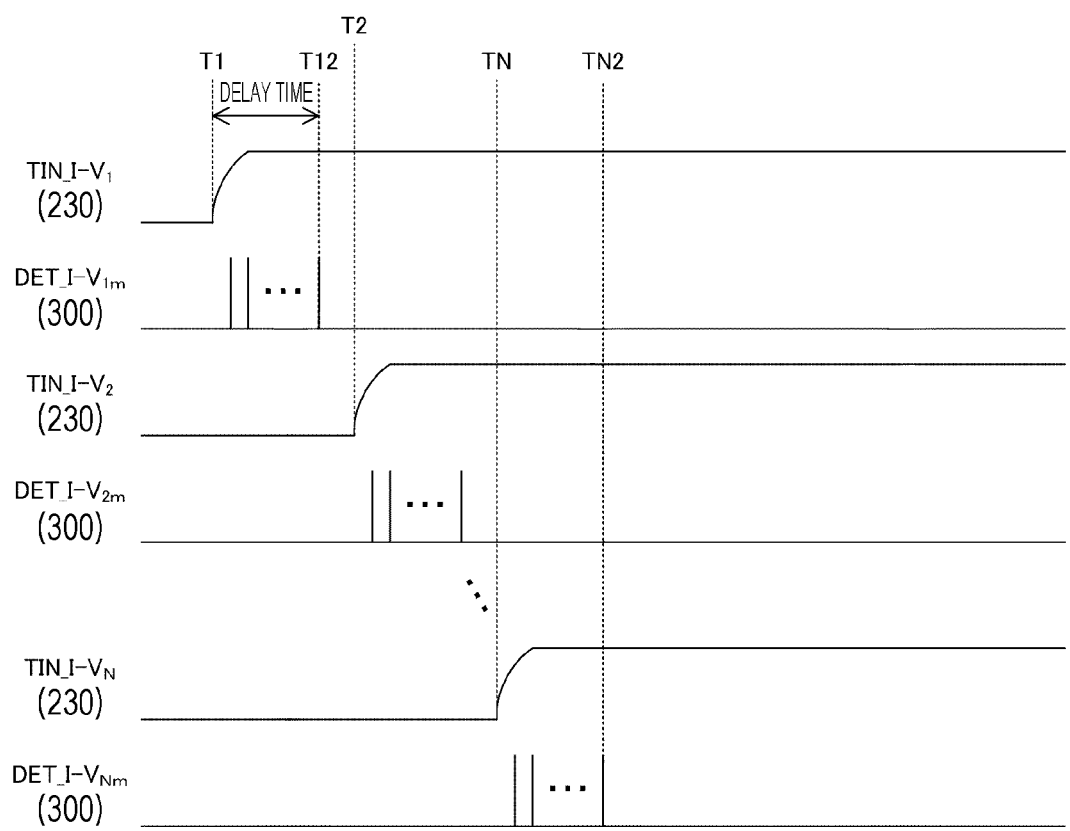
FIG. 13 is a diagram to describe a control method in a test mode in the first embodiment of the present technology.

FIG. 13 is a diagram to describe a control method in the test mode in the first embodiment of the present technology. The test control circuit 230 selects a first row at timing T1 and supplies, to the row, a test signal TIN_I-$V_1$ having a level that rises with time. An ON event detection signal DET_I-$V_{1m}$ is output from each column of the first row. Here, m is an integer of 1 to M, and M represents the number of columns. Among the detection signals DET_I-$V_{1m}$, a final signal is output at timing T12.

Then, the test control circuit 230 selects a second row at timing T2 after the timing T12, and supplies a test signal TIN_I-$V_2$ to the row. A detection signal DET_I-$V_{2m}$ is output from each column of the second row.

Similarly, third and subsequent rows are sequentially selected, and finally the test control circuit 230 selects an N-th row at timing TN after the timing T12 and supplies a test signal TIN_I-$V_N$ to the row. A detection signal DET_I-$V_{Nm}$ is output from each column of the Nth row. Among the detection signals DET_I-$V_{Nm}$, a final signal is output at timing TN2.

A delay time until the final signal is output in each row is settled depending on the number of columns and a transfer rate of an interface. For example, in the first row, a delay time from timing T1 to timing T12 is generated.

Here, in a case of provisionally using a test method in which all of pixels are simultaneously irradiated with pulsed light, the delay time until the final detection signal is output is the time from the timing T1 to TN2. When the delay time is long as described above, test accuracy in abnormality determination is degraded.

On the other hand, since a test signal is received per row in the solid-state imaging element 200, the delay time can be shortened to about 1/N, compared with the case of emitting the pulsed light with an assumption that the number of rows is N. Therefore, the test device 700 can determine presence or absence of an abnormality with high accuracy.

FIG. 14 is a diagram to describe a control method in the test mode per pixel in the first embodiment of the present technology. A reference sign "a" in this drawing is a diagram to describe a control method at the time of receiving a test signal TIN_I-V, and a reference sign "b" in the drawing is a diagram to describe a control method at the time of receiving the test signal TIN_BAFa.

The test control circuit 230 supplies, at the timing T1, the test signal TIN_I-V having a level that rises with time. At the timing T1, the current-voltage conversion circuit 310 outputs a voltage signal OUT_I-V having a level that drops in accordance with the rise of the test signal TIN_I-V. The quantizer 340 detects an OFF event at timing T11 immediately after the timing T1 and outputs an OFF event detection signal VCL.

Furthermore, the test control circuit 230 sets the selection signal SEL1 to the high level at timing T20 and causes the selector 361 to select a test signal. The test control circuit 230 supplies the test signal TIN_BAFa at timing T21. The level of the test signal TIN_BAFa rises at and after the timing T1 and drops at and after timing T23.

The quantizer 340 detects an ON event at timing T22 immediately after the timing T1, outputs the ON event detection signal VCH, detects an OFF event at timing T24 immediately after timing T23, and outputs the OFF event detection signal VCL.

As described above, the test signal may be a signal having the level that rises with time, or may be a signal that rises and drops with time. Furthermore, the test signal may also be a signal having a level that drops with time.

FIG. 15 is a diagram to describe a method of identifying an abnormal spot in the first embodiment of the present technology. The abnormal spot identification unit 720 identifies, per pixel, an abnormal spot on the basis of an abnormality signal. For example, in a case where all of the abnormality signals ERR_I-V, ERR_BAFa, ERR_BAFb, ERR_SUB, and ERR_Q indicate absence of an abnormality, a determination is made that a corresponding pixel has no abnormality.

In a case where the abnormality signal ERR_I-V indicates presence of an abnormality and the rest of the abnormality signals indicate absence of an abnormality, the abnormal spot identification unit 720 makes a determination that there is an abnormality in the current-voltage conversion circuit 310 of the corresponding pixel. In a case where the abnormality signal ERR_BAFa indicates presence of an abnormality and the rest of the abnormality signals indicate absence of an abnormality, the abnormal spot identification unit 720 makes a determination that there is an abnormality in the P-type transistor 322 on the ground side inside the buffer 320 of the corresponding pixel. In a case where the abnormality signal ERR_BAFb indicates presence of an abnormality and the rest of the abnormality signals indicate absence of an abnormality, the abnormal spot identification unit 720 makes a determination that there is an abnormality in the P-type transistor 321 on the power source side inside the buffer 320 of the corresponding pixel.

Furthermore, in a case where the abnormality signal ERR_SUB indicates presence of an abnormality and the rest of the abnormality signals indicate absence of an abnormality, the abnormal spot identification unit 720 makes a determination that there is an abnormality in the subtractor 330 of the corresponding pixel. In a case where the abnormality signal ERR_Q indicates presence of an abnormality and the rest of the abnormality signals indicate absence of an abnormality, the abnormal spot identification unit 720 makes a determination that there is an abnormality in the quantizer 340 of the corresponding pixel.

Thus, the test device 700 can identify an abnormal spot inside each pixel by analyzing a detection result when a test signal is received in each of the selectors 361 to 363.

[Exemplary Operation of Test System]

Figure 16:
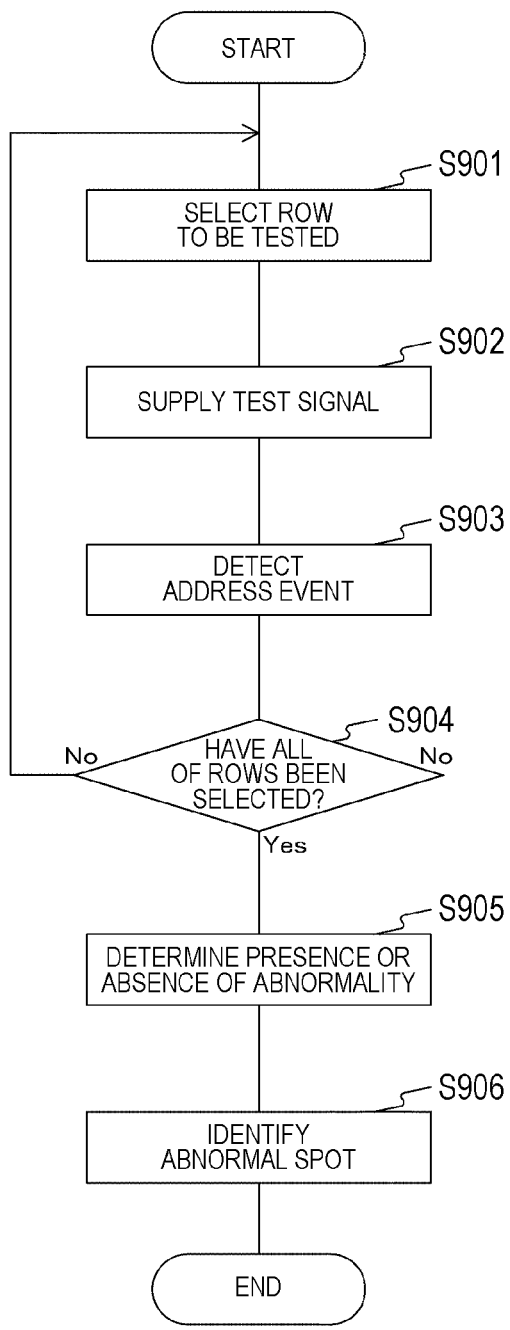
FIG. 16 is a flowchart illustrating exemplary operation of the test system in the first embodiment of the present technology.

FIG. 16 is a flowchart illustrating exemplary operation of the test system in the first embodiment of the present technology. This operation is started, for example, when the test mode is set.

The test control circuit 230 inside the solid-state imaging element 200 selects a row to be tested (step S901) and supplies a test signal to the row (step S902). The address event detection circuit 300 in the row detects an address event (step S903). The test control circuit 230 makes a determination on whether or not all of the rows have been selected (step S904). In a case where all of the rows have not been selected (step S904: No), the solid-state imaging element 200 executes step S901 and subsequent steps.

On the other hand, in a case where all of the rows have been selected (step S904: Yes), the test device 700 determines presence or absence of an abnormality per pixel on the basis of each detection signal (step S905) and identifies an abnormal spot (step S906). After step S906, the test system ends the operation for the test.

Thus, according to the first embodiment of the present technology, the test control circuit 230 supplies a test signal during the test, and the selector 361 and the like each select the test signal, and therefore, presence or absence of an abnormality in the address event detection circuit can be easily determined without using any modulation light source.

2. Second Embodiment

In a first embodiment described above, a test device 700 determines presence or absence of an abnormality per pixel, but there is a possibility that a detection signal from a defective pixel where an abnormality has occurred at the time of shift to a normal mode is transferred to a signal processing circuit 240 in a subsequent stage. Since erroneous detection frequently occurs in a defective pixel, there is a possibility of disrupting processing in the signal processing circuit 240. A test system of a second embodiment differs from that of the first embodiment in that output of a defective pixel is controlled to be disabled.

Figure 17:
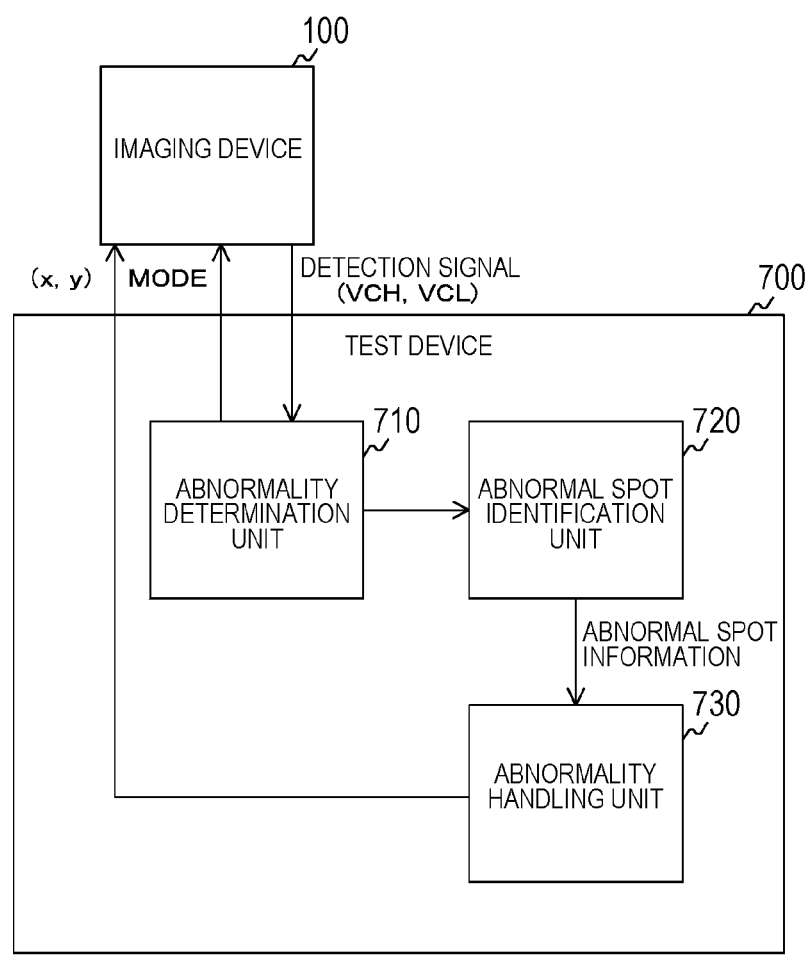
FIG. 17 is a block diagram illustrating an exemplary configuration of a test system according to a second embodiment of the present technology.

FIG. 17 is a block diagram illustrating an exemplary configuration of the test system in the second embodiment of the present technology. The test system of the second embodiment differs from that of the first embodiment in that a test device 700 further includes an abnormality handling unit 730.

The abnormality handling unit 730 supplies an address of a defective pixel to a solid-state imaging element 200 on the basis of abnormal spot information. This address is held in a memory or a register inside the solid-state imaging element 200. A circuit such as the signal processing circuit 240 or the like in the solid-state imaging element 200 reads the address of the defective pixel, controls output of the defective pixel such that the output is disabled and controls output of another normal pixel such that the output is enabled by enable signals ENx and ENy. Here, the enable signals ENx and ENy are signals that command whether or not to enable a pixel having a pixel address (x, y). For example, in a case of enabling a pixel, a high level is set to both of the enable signals ENx and ENy, and in a case of disabling a pixel, a low level is set to at least one thereof.

Figure 18:
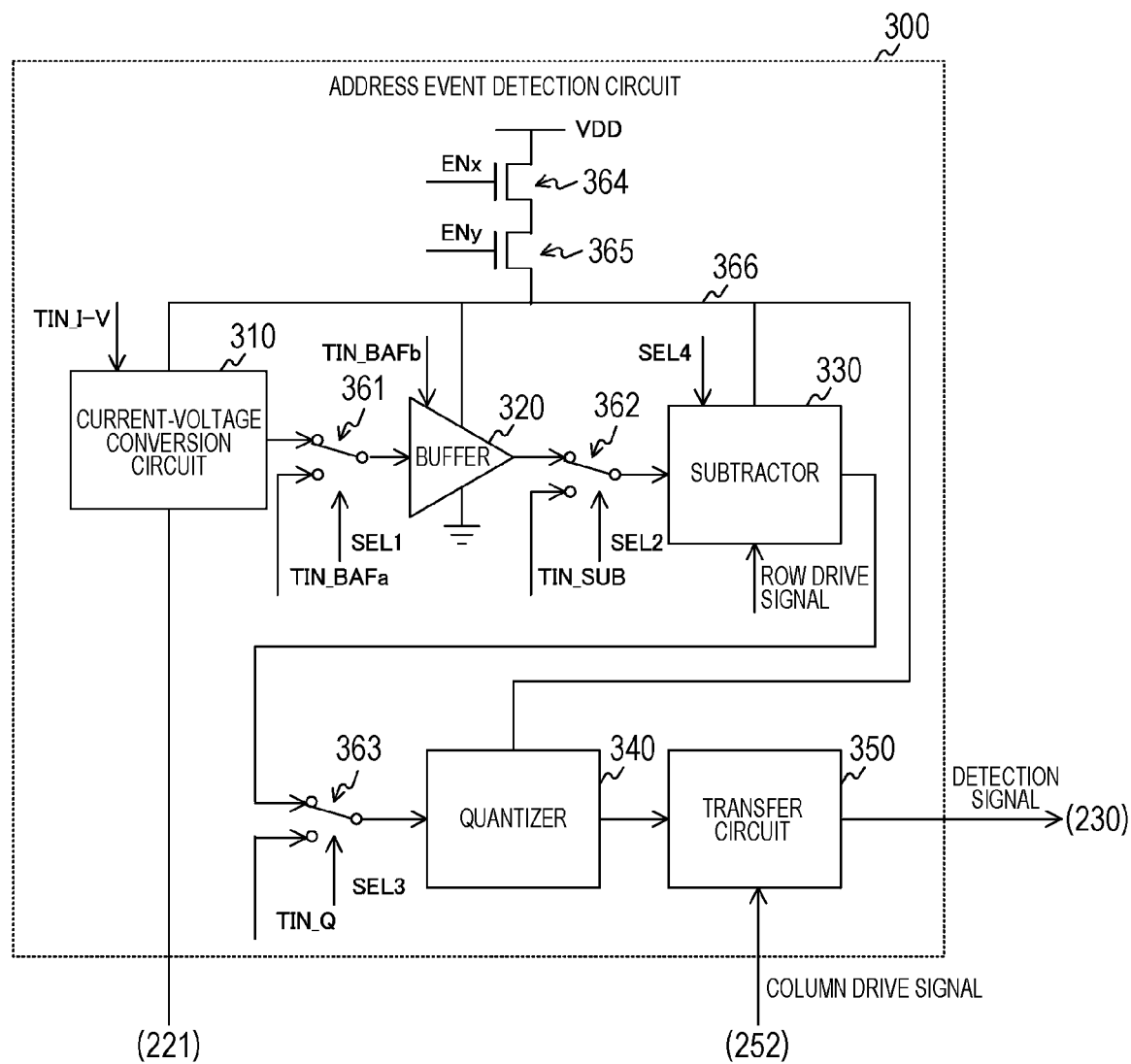
FIG. 18 is a block diagram illustrating an exemplary configuration of an address event detection circuit in the second embodiment of the present technology.

FIG. 18 is a block diagram illustrating an exemplary configuration of an address event detection circuit 300 in the second embodiment of the present technology. The address event detection circuit 300 of the second embodiment differs from that of the first embodiment in further including N-type transistors 364 and 365. As these transistors, MOS transistors are used, for example.

The N-type transistors 364 and 365 cut off a power source of each of a current-voltage conversion circuit 310, a buffer 320, a subtractor 330, a quantizer 340, and a transfer circuit 350. As these transistors, MOS transistors are used, for example. The N-type transistors 364 and 365 are connected in series between a power source terminal and a power source line 366, and the enable signals ENx and ENy are received in gates thereof respectively. The power source line 366 is connected to a power source terminal in each of the current-voltage conversion circuit 310, the buffer 320, the subtractor 330, the quantizer 340, and the transfer circuit 350. Since the N-type transistors 364 and 365 cut off the power source, a detection signal is not output to the signal processing circuit 240 from a pixel set as disable (defective pixel). When the output from the defective pixel is thus invalidated, it is possible to prevent processing of the signal processing circuit 240 from being disrupted by an erroneous detection signal from the defective pixel. On the other hand, a detection signal is output to the signal processing circuit 240 from a normal pixel set as enable.

Thus, according to the second embodiment of the present technology, the test device 700 cuts off a power source of a defective pixel where an abnormality has occurred, and therefore, it is possible to invalidate output from the pixel.

3. Third Embodiment

In a first embodiment described above, a test control circuit 230 is arranged on a detection chip 202, but a circuit scale of the detection chip 202 is increased by an amount of the circuit. A solid-state imaging element 200 according to a second embodiment differs from that of the first embodiment in arranging the test control circuit 230 on a light-receiving chip 201.

Figure 19:
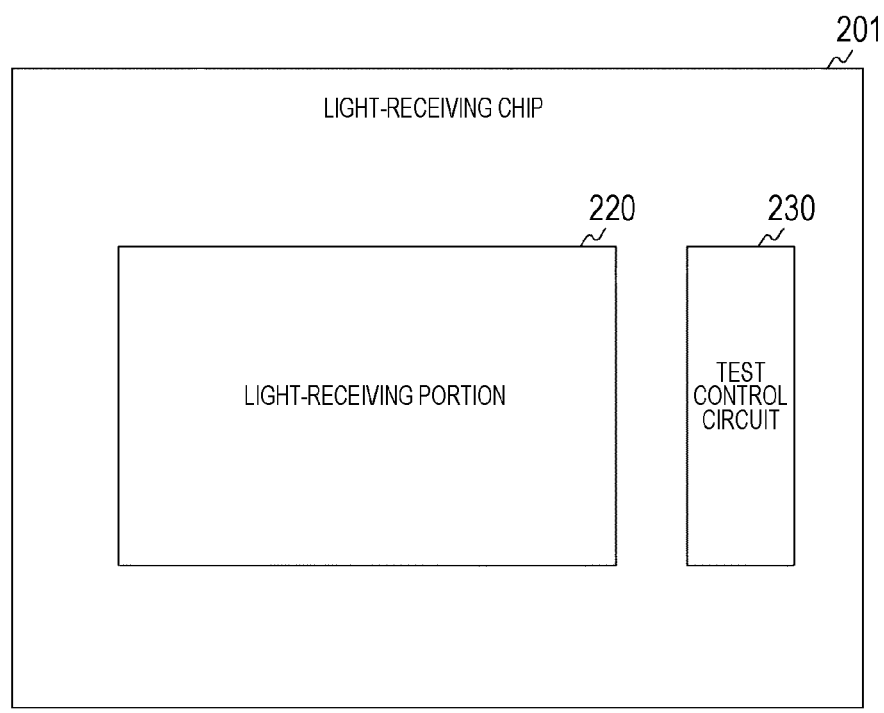
FIG. 19 is an exemplary plan view of a light-receiving chip in a third embodiment of the present technology.

FIG. 19 is an exemplary plan view of the light-receiving chip 201 in the third embodiment of the present technology. The light-receiving chip 201 of the third embodiment differs from that of the first embodiment in that the test control circuit 230 is further arranged. Inside the test control circuit 230, a via to connect the detection chip 202 is further arranged. A circuit scale of the light-receiving chip 201 is increased by the amount of the test control circuit 230, but even though the test control circuit 230 is provided, the circuit scale of the light-receiving chip 201 is often smaller than that of the detection chip 202, and no serious problem is not caused.

Figure 20:
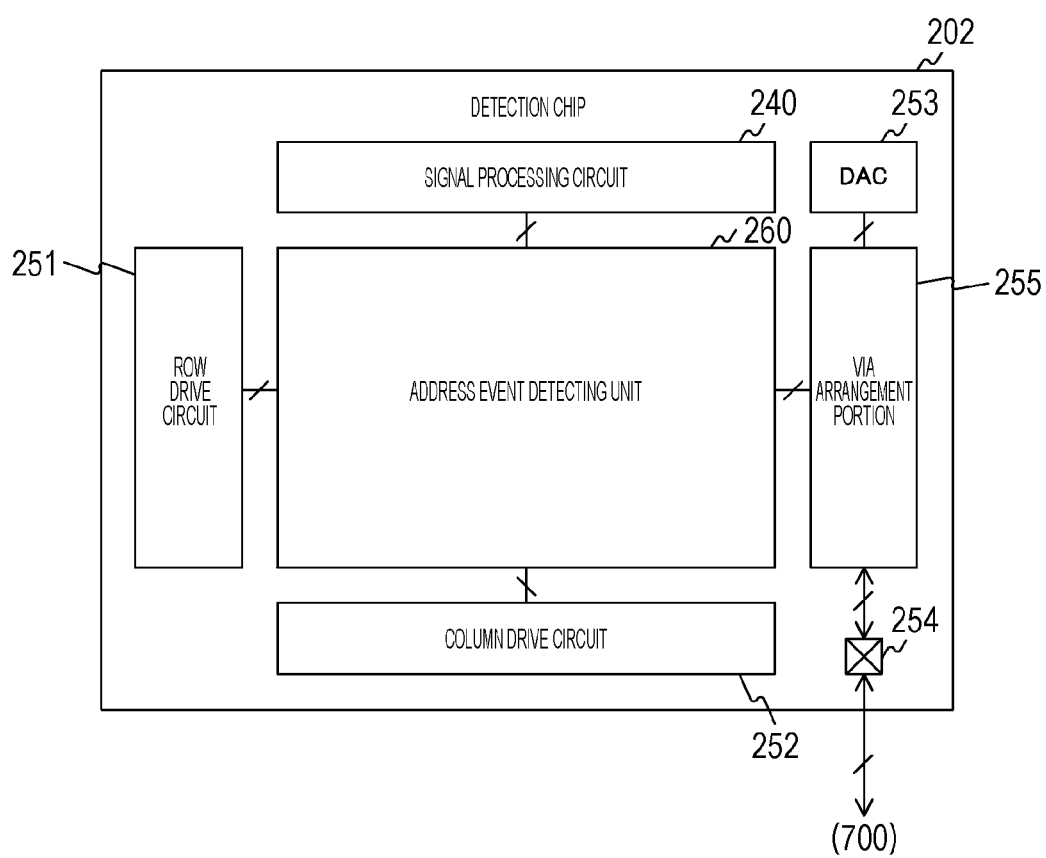
FIG. 20 is an exemplary plan view of a detection chip in the third embodiment of the present technology.

FIG. 20 is an exemplary plan view of the detection chip 202 in the third embodiment of the present technology. The detection chip 202 of the third embodiment differs from that of the first embodiment in that a via arrangement portion 255 is arranged instead of the test control circuit 230. In the via arrangement portion 255, a via to connect the test control circuit 230 inside the light-receiving chip 201 is arranged.

Thus, in the third embodiment of the present technology, since the test control circuit 230 is arranged on the light-receiving chip 201, the circuit scale of the detection chip 202 can be reduced more than that in the case where the test control circuit 230 is arranged on the detection chip 202.

4. Exemplary Application to Moving Object

The technology according to the present disclosure (present technology) can be applied to various products. For example, the technology according to the present disclosure may be implemented as a device mounted on any kind of moving objects such as a car, an electric car, a hybrid electric car, a motorcycle, a bicycle, a personal mobility, an airplane, a drone, a ship, a robot, and the like.

Figure 21:
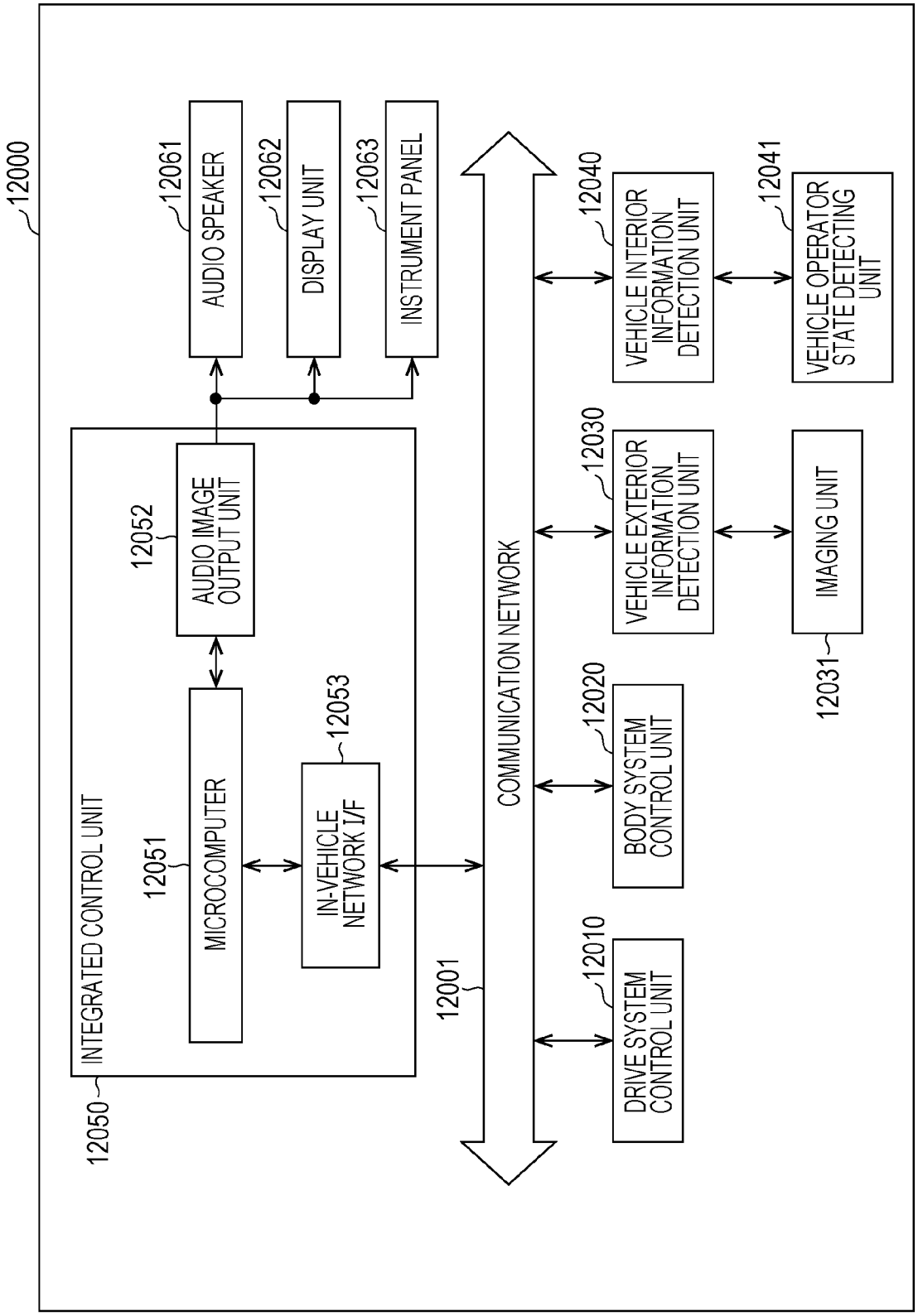
FIG. 21 is a block diagram illustrating an exemplary schematic configuration of a vehicle control system.

FIG. 21 is a block diagram illustrating an exemplary schematic configuration of a vehicle control system that is an exemplary moving object control system to which the technology according to the present disclosure can be applied.

The vehicle control system 12000 includes a plurality of electronic control units connected via a communication network 12001. In the example illustrated in FIG. 21, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices associated with a drive system of a vehicle in accordance with various kinds of programs. For example, the drive system control unit 12010 functions as a control device for: a drive force generation device to generate drive force of a vehicle, such as an internal combustion engine, a drive motor, or the like; a drive force transmission mechanism to transmit drive force to wheels; a steering mechanism that adjusts a steering angle of the vehicle; a brake device that generates brake force of the vehicle; and the like.

The body system control unit 12020 controls operation of various kinds of devices equipped on a vehicle body in accordance with various kinds of programs. For example, the body system control unit 12020 functions as a control device for: a keyless entry system, a smart key system; a power window device; or various kinds of lamps such as a headlamp, a back lamp, a brake lamp, a turn indicator, a fog lamp, or the like. In this case, radio waves transmitted from a portable machine substituted for a key, or signals of various kinds of switches can be received in the body system control unit 12020. The body system control unit 12020 accepts these radio waves or signals and controls a door lock device, a power window device, a lamp, and the like of the vehicle.

The vehicle exterior information detection unit 12030 detects information associated with the outside of the vehicle having the vehicle control system 12000 mounted thereon. For example, the vehicle exterior information detection unit 12030 has an imaging unit 12031 connected thereto. The vehicle exterior information detection unit 12030 causes the imaging unit 12031 to capture an image of the outside of the vehicle, and receives the captured image. The vehicle exterior information detection unit 12030 may perform object detection processing or distance detection processing relative to a person, a vehicle, an obstacle, a sign, characters on a road surface, or the like, on the basis of the received image.

The imaging unit 12031 is an optical sensor that receives light and outputs an electric signal in accordance with an amount of the received light. The imaging unit 12031 can output an electric signal as an image and can also output an electric signal as ranging information. Furthermore, the light received by the imaging unit 12031 may be visible light or may be invisible light such as infrared light or the like.

The vehicle interior information detection unit 12040 detects information associated with the inside of the vehicle. For example, the vehicle interior information detection unit 12040 is connected to a vehicle operator state detecting unit 12041 that detects a state of a vehicle operator. The vehicle operator state detecting unit 12041 includes, for example, a camera that captures images of the vehicle operator, and the vehicle interior information detection unit 12040 may evaluate a degree of fatigue or a degree of concentration of the vehicle operator on the basis of the detection information received from the vehicle operator state detecting unit 12041, or may discriminate whether or not the vehicle operator is dozing off.

The microcomputer 12051 calculates a control target value for the drive force generation device, the steering mechanism, or the brake device on the basis of information associated with the inside or the outside of the vehicle acquired by the vehicle exterior information detection unit 12030 or the vehicle interior information detection unit 12040, and can output a control command to the drive system control unit 12010. For example, the microcomputer 12051 can perform cooperative control intended to implement functions of an advanced driver assistance system (ADAS) including: collision avoidance or impact mitigation of a vehicle; adaptive cruise based on an inter-vehicle distance; speed maintaining cruise; vehicle collision warning; vehicle lane departure warning; and the like.

Furthermore, the microcomputer 12051 controls the drive force generation device, the steering mechanism, the brake device, or the like on the basis of information associated with a periphery of the vehicle acquired by the vehicle exterior information detection unit 12030 or the vehicle interior information detection unit 12040, thereby achieving cooperative control intended to perform automated cruise and the like in which autonomous travel is performed without depending on operation by a vehicle operator.

Furthermore, the microcomputer 12051 can output a control command to the body system control unit 12020 on the basis of the vehicle exterior information acquired in the vehicle exterior information detection unit 12030. For example, the microcomputer 12051 controls a headlamp in accordance with a position of a preceding vehicle or an oncoming vehicle sensed by the vehicle exterior information detection unit 12030, and can perform cooperative control intended to perform an anti-dazzling such as switching a high beam to a low beam, and the like.

The audio image output unit 12052 transmits an output signal of at least one of audio or an image to an output device that can provide a notification of visual or audible information to a vehicle occupant or to the vehicle exterior. In the example of FIG. 21, an audio speaker 12061, a display unit 12062, and an instrument panel 12063 are exemplified as the output devices. The display unit 12062 may include at least one of an on-board display or a head-up display, for example.

Figure 22:
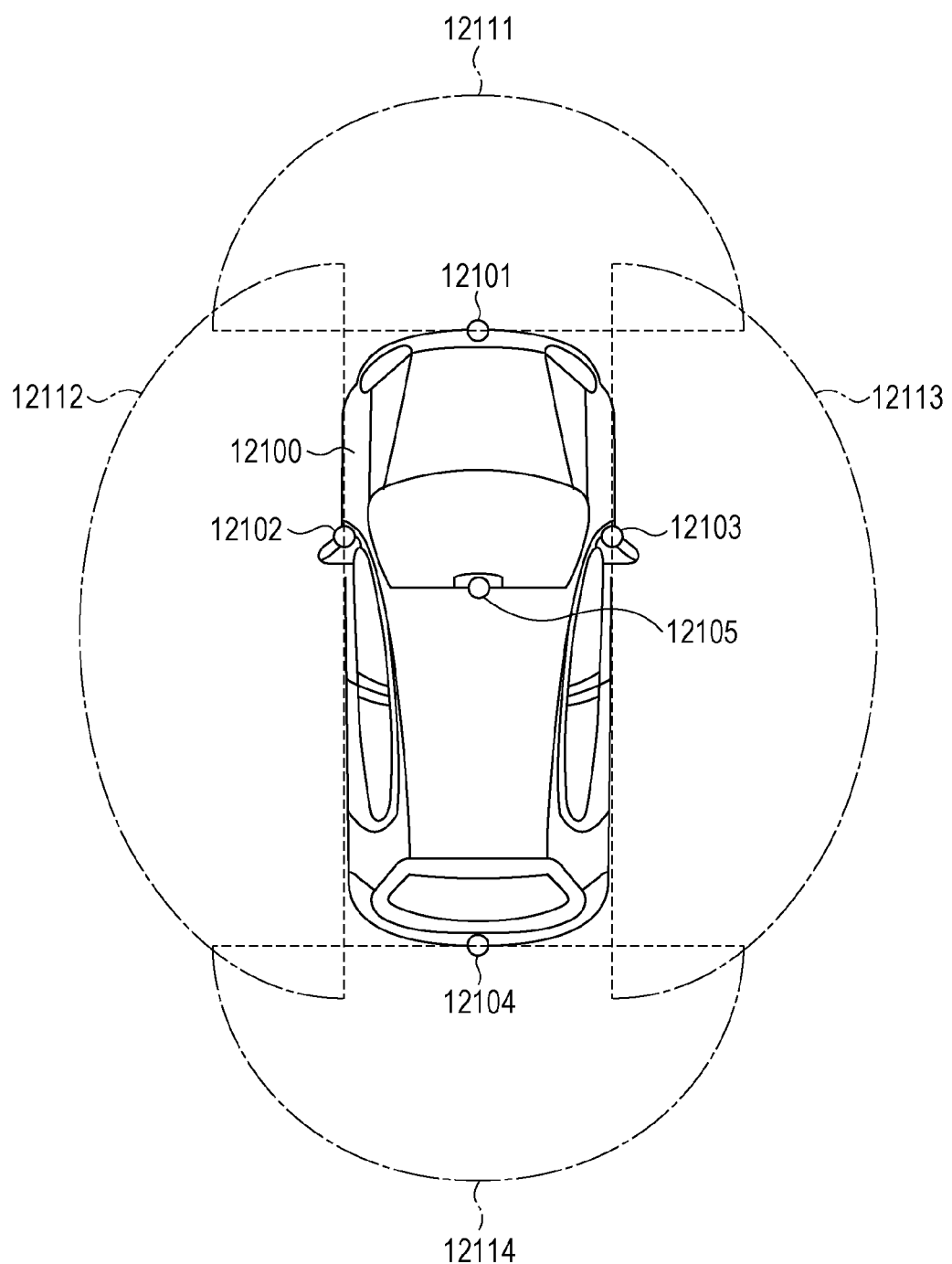
FIG. 22 is an explanatory diagram illustrating exemplary installation positions of imaging units.

FIG. 22 is a diagram illustrating exemplary installation positions of the imaging units 12031.

In FIG. 22, imaging units 12101, 12102, 12103, 12104, and 12105 are included as the imaging units 12031.

For example, the imaging units 12101, 12102, 12103, 12104, and 12105 are provided at positions such as a front nose, a side mirror, a rear bumper, a back door, an upper portion of a front windshield inside a vehicle interior of a vehicle 12100, and the like. The imaging unit 12101 provided at the front nose and the imaging unit 12105 provided at an upper portion of the front windshield inside the vehicle interior mainly acquire images in front of the vehicle 12100. The imaging units 12102 and 12103 provided at the side mirrors mainly acquire images of lateral sides of the vehicle 12100. The imaging unit 12104 provided at the rear bumper or the back door mainly acquire an image behind the vehicle 12100. The imaging unit 12105 provided at the upper portion of the front windshield in the vehicle interior is mainly used to detect a preceding vehicle, a pedestrian, an obstacle, a traffic signal, a traffic sign, a lane, and the like.

Note that FIG. 22 illustrates exemplary imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the respective side mirrors, and an imaging range 12114 indicates an imaging range of the imaging unit 12104 provided at the rear bumper or the back door. For example, an overhead view image of the vehicle 12100 viewed from above can be obtained by overlapping pieces of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element including pixels for detecting a phase difference.

For example, the microcomputer 12051 obtains, on the basis of distance information acquired from the imaging units 12101 to 12104: a distance to each of three-dimensional objects within the imaging ranges 12111 to 12114; and a temporal change of the distance (a relative speed with respect to the vehicle 12100), and as a result, it is possible to extract, as a preceding vehicle, a closest three-dimensional object which exists particularly on a traveling route of the vehicle 12100 and travels at a predetermined speed (e.g., 0 km/h or more) in a direction substantially same as the vehicle 12100. Moreover, the microcomputer 12051 can preliminarily set an inter-vehicle distance to be secured in a front space with a preceding vehicle, and can perform automatic brake control (also including adaptive cruise stop control), automatic acceleration control (also including adaptive cruise start control), and the like. Thus, it is possible to perform cooperative control intended to perform the automated cruise and the like in which autonomous travel is performed without depending on operation of a vehicle operator.

For example, the microcomputer 12051 extracts three-dimensional object data associated with a three-dimensional object while categorizing the three-dimensional object into a two-wheeled vehicle, a regular vehicle, a large vehicle, a pedestrian, or another three-dimensional object such as a telephone pole or the like on the basis of the distance information obtained from the imaging units 12101 to 12104, and can use the extracted data to automatically avoid obstacles. For example, the microcomputer 12051 distinguishes whether an obstacle in the periphery of the vehicle 12100 is an obstacle visible to a vehicle driver of the vehicle 12100 or an obstacle hardly visible to the vehicle driver. Then, the microcomputer 12051 makes a determination on a collision risk indicating a risk level of collision with each obstacle, and when the collision risk is a setting value or more and there is a possibility of collision, the microcomputer 12051 can provide operational assistance in order to avoid the collision by outputting an alarm to the vehicle driver via the audio speaker 12061 and the display unit 12062 or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is included in the captured images of the imaging units 12101 to 12104. Such pedestrian recognition is performed by, for example: a procedure of extracting feature points in the captured images of the imaging units 12101 to 12104 provided as the infrared cameras; and a procedure of discriminating whether or not an object is a pedestrian by applying pattern matching processing to a series of feature points indicating an outline of the object. When the microcomputer 12051 determines that a pedestrian is included in the captured images of the imaging units 12101 to 12104 and recognizes the pedestrian, the audio image output unit 12052 controls the display unit 12062 such that the display unit 12062 displays, for emphasis, a rectangular contour line over the recognized pedestrian in a superimposed manner. Furthermore, the audio image output unit 12052 may also control the display unit 12062 such that the display unit 12062 displays an icon or the like indicating the pedestrian at a desired position.

The exemplary vehicle control system to which the technology according to the present disclosure can be applied has been described above. The technology according to the present disclosure can be applied to the imaging unit 12031 among the configurations described above. Specifically, the imaging device 100 in FIG. 1 can be applied to the imaging unit 12031. By applying the technology according to the present disclosure to the imaging device 100, presence or absence of an abnormality in a pixel can be easily determined, and therefore, it is possible to improve reliability of the vehicle control system.

Note that the above-described embodiments are exemplified in order to embody the present technology, and the matters recited in the embodiments and matters specifying the invention in the claims have corresponding relations, respectively. Similarly, the matters specifying the invention in the claims and the matters denoted by the same names in the embodiments of the present technology have corresponding relations, respectively. However, note that the present technology is not limited to the embodiments and can be embodied by making various modifications to the embodiments without departing from the gist thereof.

Note that the effects described in the present specification are merely the examples and not limited thereto, and furthermore, additional effects may also be provided.

Note that the present technology can also adopt the following configurations.

(1) A solid-state imaging element including:
a photoelectric conversion element that converts incident light into an electric signal by photoelectric conversion;
a test signal supply unit that supplies, as a test signal, a signal that fluctuates with time;
a selection unit that selects either the electric signal or the test signal; and
a comparator that compares a predetermined threshold value with the signal selected by the selection unit, and outputs a result of the comparison.

(2) The solid-state imaging element recited in (1) above, further including:
a current-voltage conversion circuit that converts a current signal into a voltage signal;
a buffer that outputs a buffer input signal as a buffer output signal; and
a subtractor that outputs, as a differential signal, a change amount of a signal to be differentiated by subtraction,
in which the photoelectric conversion element outputs the current signal as the electric signal to the current-voltage conversion circuit.

(3) The solid-state imaging element recited in (2) above, in which
the test signal includes a first test signal,
the selection unit includes a first selector that selects either the voltage signal or the first test signal and supplies the selected signal to the buffer as the buffer input signal, and
the test signal supply unit supplies the first test signal to the first selector.

(4) The solid-state imaging element recited in (2) or (3) above, in which
the test signal includes a second test signal,
the selection unit includes a second selector that selects either the buffer output signal or the second test signal and supplies the selected signal to the subtractor as the signal to be differentiated, and the test signal supply unit supplies the second test signal to the second selector.

(5) The solid-state imaging element recited in any one of (2) to (4) above, in which
the test signal includes a third test signal,
the selection unit includes a third selector that selects either the differential signal or the third test signal and supplies the selected signal to the comparator, and
the test signal supply unit supplies the third test signal to the third selector.

(6) The solid-state imaging element recited in any one of (2) to (5) above, in which
the test signal includes a fourth test signal, and
the test signal supply unit supplies the fourth test signal to the current-voltage conversion circuit.

(7) The solid-state imaging element recited in any one of (2) to (6) above, in which
the test signal includes a fifth test signal, and
the test signal supply unit supplies the fifth test signal to the buffer.

(8) The solid-state imaging element recited in any one of (2) to (7) above, in which
in a case where the electric signal is supplied, the subtractor amplifies the signal to be differentiated with a gain larger than a gain in a case where the test signal is supplied.

(9) The solid-state imaging element recited in any one of (2) to (8) above, further including
a transistor that opens and closes, in accordance with a predetermined enable signal, a path between a power source and each of the current-voltage conversion circuit, the buffer, the subtractor, and the comparator.

(10) The solid-state imaging element recited in any one of (1) to (9) above, in which
the photoelectric conversion element is arranged on a predetermined light-receiving chip, and
the selection unit and the comparator are arranged on a detection chip laminated on the light-receiving chip.

(11) The solid-state imaging element recited in (10) above, in which
the test signal supply unit is arranged on the detection chip.

(12) The solid-state imaging element recited in (10) above, in which
the test signal supply unit is arranged on the light-receiving chip.

(13) A test system including:
a photoelectric conversion element that converts incident light into an electric signal by photoelectric conversion;
a test signal supply unit that supplies, as a test signal, a signal that fluctuates with time;
a selection unit that selects either the electric signal or the test signal;
a comparator that compares a predetermined threshold value with the signal selected by the selection unit, and outputs a result of the comparison; and
an abnormality determination unit that determines presence or absence of an abnormality on the basis of the comparison result.

(14) The test system recited in (13) above, further including
a signal processing circuit that invalidates an address event detection circuit having an abnormality out of a plurality of address event detection circuits, in which
the selection unit and the comparator are arranged in each of the plurality of address event detection circuits, and
the abnormality determination unit determines presence or absence of an abnormality with regard to each of the plurality of address event detection circuits.

(15) A control method for a solid-state imaging element, including:
a test signal supply procedure of supplying, as a test signal, a signal that fluctuates with time;
a selection procedure of selecting either the test signal or an electric signal generated by a photoelectric conversion element that converts incident light into the electric signal by photoelectric conversion; and
a comparison procedure of comparing a predetermined threshold value with the signal selected by the selection unit, and outputting a result of the comparison.

REFERENCE SIGNS LIST

100 Imaging device
110 Imaging lens
120 Recording unit
130 Control unit
200 Solid-state imaging element
201 Light-receiving chip
202 Detection chip
220 Light-receiving portion
221 Photodiode
222, 255, 261 Via arrangement portion
230 Test control circuit
231 Test signal supply unit
232 Selection signal supply unit
233 Detection signal transmission unit
240 Signal processing circuit
251 Row drive circuit
252 Column drive circuit
253 DAC
254 Pad
255 Via arrangement portion
260 Address event detecting unit
300 Address event detection circuit
310 Current-voltage conversion circuit
311, 313, 336, 343, 344, 364, 365 N-type transistor
312, 321, 322, 334, 335, 341, 342 P-type transistor
320 Buffer
330 Subtractor
331, 332, 333 Capacitor
337 Switch
340 Quantizer
350 Transfer circuit
361, 362, 363 Selector
700 Test device
710 Abnormality determination unit
720 Abnormal spot identification unit
730 Abnormality handling unit
12031 Imaging unit

The invention claimed is:
1. A solid-state imaging element comprising:
a photodiode configured to convert incident light into an electric signal by photoelectric conversion;
test signal supply circuitry configured to supply a test signal;
selection circuitry configured to select either the electric signal or the test signal;
a comparator configured to receive the electric signal and the test signal, and to compare a predetermined threshold value with either the electric signal or the test signal, depending upon the signal selected by the selection circuitry, and output a result of the comparison;
a current-voltage conversion circuit configured to convert a current signal into a voltage signal, wherein the photodiode outputs the current signal as the electric signal to the current-voltage conversion circuit;

a buffer configured to output a buffer input signal as a buffer output signal; and a subtractor configured to output, as a differential signal, a change amount of a signal to be differentiated by subtraction.

2. The solid-state imaging element according to claim 1, wherein the test signal includes a first test signal, the selection circuitry includes a first selector configured to select either the voltage signal or the first test signal and supply the selected signal to the buffer as the buffer input signal, and the test signal supply circuitry supplies the first test signal to the first selector.

3. The solid-state imaging element according to claim 1, wherein the test signal includes a second test signal, the selection circuitry includes a second selector configured to select either the buffer output signal or the second test signal and supply the selected signal to the subtractor as the signal to be differentiated, and the test signal supply circuitry supplies the second test signal to the second selector.

4. The solid-state imaging element according to claim 1, wherein the test signal includes a third test signal, the selection circuitry includes a third selector configured to select either the differential signal or the third test signal and supply the selected signal to the comparator, and the test signal supply circuitry supplies the third test signal to the third selector.

5. The solid-state imaging element according to claim 1, wherein the test signal includes a fourth test signal, and the test signal supply circuitry supplies the fourth test signal to the current-voltage conversion circuit.

6. The solid-state imaging element according to claim 1, wherein the test signal includes a fifth test signal, and the test signal supply circuitry supplies the fifth test signal to the buffer.

7. The solid-state imaging element according to claim 1, wherein in a case where the electric signal is supplied, the subtractor amplifies the signal to be differentiated with a gain larger than a gain in a case where the test signal is supplied.

8. The solid-state imaging element according to claim 1, further comprising a transistor configured to open and close, in accordance with a predetermined enable signal, a path between a power source and each of the current-voltage conversion circuit, the buffer, the subtractor, and the comparator.

9. The solid-state imaging element according to claim 1, wherein the photodiode is arranged on a predetermined light-receiving chip, and the selection circuitry and the comparator are arranged on a detection chip laminated on the light-receiving chip.

10. The solid-state imaging element according to claim 9, wherein the test signal supply circuitry is arranged on the detection chip.

11. The solid-state imaging element according to claim 9, wherein the test signal supply circuitry is arranged on the light-receiving chip.

12. A test system comprising:

a photodiode configured to convert incident light into an electric signal by photoelectric conversion;

test signal supply circuitry configured to supply a test signal;

selection circuitry configured to select either the electric signal or the test signal;

a comparator configured to receive the electric signal and the test signal, and to compare a predetermined threshold value with either the electric signal or the test signal, depending upon the signal selected by the selection circuitry, and output a result of the comparison;

abnormality determination circuitry configured to determine presence or absence of an abnormality on a basis of the comparison result; and a signal processing circuit configured to invalidate an address event detection circuit having an abnormality out of a plurality of address event detection circuits, wherein the selection circuitry and the comparator are arranged in each of the plurality of address event detection circuits, and the abnormality determination circuitry determines presence or absence of an abnormality with regard to each of the plurality of address event detection circuits.

13. A control method for a solid-state imaging element, comprising:

supplying, as a test signal;

selecting, by selection circuitry, either the test signal or an electric signal generated by a photodiode that converts incident light into the electric signal by photoelectric conversion;

receiving, by a comparator, the test signal and the electric signal, depending upon the signal selected by the selection circuitry, and comparing a predetermined threshold value with either the test signal or the electric signal, depending upon the signal selected by the selection circuitry;

outputting a result of the comparison;

converting, by a current-voltage conversion circuit, a current signal into a voltage signal, wherein the photodiode outputs the current signal as the electric signal to the current-voltage conversion circuit;

outputting, by a buffer, a buffer input signal as a buffer output signal; and outputting, by a subtractor, as a differential signal, a change amount of a signal to be differentiated by subtraction.

14. A test system comprising:

a photodiode configured to convert incident light into an electric signal by photoelectric conversion;

test signal supply circuitry configured to supply a test signal;

selection circuitry configured to select either the electric signal or the test signal;

a comparator configured to receive the electric signal and the test signal, and to compare a predetermined threshold value with either the electric signal or the test signal, depending upon the signal selected by the selection circuitry, and output a result of the comparison;

abnormality determination circuitry configured to determine presence or absence of an abnormality on a basis of the comparison result;

a current-voltage conversion circuit configured to convert a current signal into a voltage signal;

a buffer configured to output a buffer input signal as a buffer output signal; and a subtractor configured to output, as a differential signal, a change amount of a signal to be differentiated by subtraction, wherein the photodiode outputs the current signal as the electric signal to the current-voltage conversion circuit.

15. The test system according to claim 14, wherein the test signal includes a first test signal, the selection circuitry includes a first selector configured to select either the voltage signal or the first test signal and supply the selected signal to the buffer as the buffer input signal, and the test signal supply circuitry supplies the first test signal to the first selector.

16. The test system according to claim 14, wherein the test signal includes a second test signal, the selection circuitry includes a second selector configured to select either the buffer output signal or the second test signal and supply the selected signal to the subtractor as the signal to be differentiated, and the test signal supply circuitry supplies the second test signal to the second selector.

17. The test system according to claim 14, wherein the test signal includes a third test signal, the selection circuitry includes a third selector configured to select either the differential signal or the third test signal and supply the selected signal to the comparator, and the test signal supply circuitry supplies the third test signal to the third selector.

* * * * *